United States Patent
Weissman et al.

(10) Patent No.: US 8,559,865 B2
(45) Date of Patent: Oct. 15, 2013

(54) METHOD AND APPARATUS FOR PROVIDING JAMMER DETECTION IN A RECEIVER

(75) Inventors: Haim M. Weissman, Haifa (IL); Avigdor Brillant, Haifa (IL); Susanta Sengupta, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 894 days.

(21) Appl. No.: 12/508,308

(22) Filed: Jul. 23, 2009

(65) Prior Publication Data

US 2010/0026547 A1 Feb. 4, 2010

Related U.S. Application Data

(60) Provisional application No. 61/085,325, filed on Jul. 31, 2008.

(51) Int. Cl.
*H04K 3/00* (2006.01)

(52) U.S. Cl.
USPC ...... 455/1; 342/16; 342/17; 342/18; 375/139; 380/252; 380/253; 380/254

(58) Field of Classification Search
USPC ............... 455/1, 234.1; 375/298; 342/16, 17
See application file for complete search history.

(56) References Cited

U.S. PATENT DOCUMENTS

| | | | | |
|---|---|---|---|---|
| 3,859,661 A | * | 1/1975 | Ruvin et al. | 342/16 |
| 4,267,592 A | * | 5/1981 | Craiglow | 370/280 |
| 4,285,060 A | * | 8/1981 | Cobb et al. | 375/376 |
| 4,388,723 A | * | 6/1983 | Keen | 375/136 |
| 4,549,183 A | * | 10/1985 | Farina | 342/17 |
| 4,573,051 A | * | 2/1986 | Farina | 342/17 |
| 4,654,884 A | * | 3/1987 | Sakai et al. | 455/183.2 |
| 4,719,649 A | * | 1/1988 | Woodsum et al. | 455/1 |

(Continued)

FOREIGN PATENT DOCUMENTS

| | | |
|---|---|---|
| CN | 1194556 A | 9/1998 |
| CN | 1346545 A | 4/2002 |

(Continued)

OTHER PUBLICATIONS

International Search Report & Written Opinion—PCT/US09/052245 International Search Authority—European Patent Office—Dec. 2, 2009.

(Continued)

*Primary Examiner* — Hai Nguyen
(74) *Attorney, Agent, or Firm* — Kevin T. Cheatham

(57) ABSTRACT

A method and apparatus for detecting a jammer comprising sampling an input signal; downconverting and sampling the input signal to generate a sampled downconverted (SD) input signal; comparing the sampled input signal to a wideband threshold $TH_{WB}$, and comparing the SD input signal to a narrowband threshold $TH_{NB}$; generating a wideband (WB) interrupt signal based on the comparison to the $TH_{WB}$, and generating a narrowband (NB) interrupt signal based on the comparison to the $TH_{NB}$; and generating a composite interrupt signal based on at least one of WB interrupt signal and NB interrupt signal. In one aspect, the apparatus comprises a wideband jammer detector for generating a WB interrupt signal to indicate a wideband jammer; a narrowband jammer detector for generating a NB interrupt signal to indicate a narrowband jammer; and interrupt logic for generating a composite interrupt signal based on one of WB interrupt signal and NB interrupt signal.

79 Claims, 28 Drawing Sheets

(56) References Cited

U.S. PATENT DOCUMENTS

| | | | |
|---|---|---|---|
| 5,027,121 A * | 6/1991 | Hulland | 342/16 |
| 5,233,351 A * | 8/1993 | Gregory et al. | 342/100 |
| 5,291,202 A * | 3/1994 | McClintock | 342/16 |
| 5,438,332 A * | 8/1995 | Adam et al. | 342/45 |
| 5,661,491 A * | 8/1997 | Jones | 342/418 |
| 5,748,144 A * | 5/1998 | Rodal | 342/357.4 |
| 5,822,429 A * | 10/1998 | Casabona et al. | 380/252 |
| 5,883,596 A * | 3/1999 | Rodal | 342/357.4 |
| 5,955,987 A * | 9/1999 | Murphy et al. | 342/357.29 |
| 6,009,129 A * | 12/1999 | Kenney et al. | 375/346 |
| 6,130,907 A * | 10/2000 | Chen | 370/342 |
| 6,229,998 B1 * | 5/2001 | Hamdy et al. | 455/226.1 |
| 6,295,017 B1 * | 9/2001 | Ivanov et al. | 342/17 |
| 6,420,995 B1 * | 7/2002 | Richmond et al. | 342/45 |
| 6,639,541 B1 * | 10/2003 | Quintana et al. | 342/18 |
| 6,741,633 B1 * | 5/2004 | Cangiani et al. | 375/132 |
| 7,095,779 B2 * | 8/2006 | Karlsson | 375/130 |
| 7,126,979 B2 * | 10/2006 | Karlsson | 375/130 |
| 7,460,615 B2 * | 12/2008 | Kunysz et al. | 375/316 |
| 7,536,159 B2 * | 5/2009 | Razzell | 455/250.1 |
| 7,599,670 B2 | 10/2009 | Turner | |
| 8,009,724 B2 * | 8/2011 | Razzell et al. | 375/150 |
| 8,059,695 B2 * | 11/2011 | Manzi | 375/141 |
| 8,103,234 B2 * | 1/2012 | Razzell | 455/250.1 |
| 8,116,253 B2 * | 2/2012 | Anderson | 370/318 |
| 8,140,001 B2 * | 3/2012 | Haverty | 455/1 |
| 8,155,649 B2 * | 4/2012 | Mchenry et al. | 455/434 |
| 2003/0054755 A1 * | 3/2003 | Zehavi et al. | 455/1 |
| 2003/0164794 A1 * | 9/2003 | Haynes et al. | 342/353 |
| 2004/0077306 A1 * | 4/2004 | Shor et al. | 455/1 |
| 2005/0079842 A1 | 4/2005 | Shi | |
| 2005/0217999 A1 * | 10/2005 | You et al. | 205/81 |
| 2006/0003726 A1 * | 1/2006 | Razzell | 455/323 |
| 2006/0003750 A1 * | 1/2006 | Ranganathan et al. | 455/414.1 |
| 2006/0019723 A1 * | 1/2006 | Vorenkamp et al. | 455/574 |
| 2006/0217063 A1 * | 9/2006 | Parthasarathy | 455/39 |
| 2006/0222116 A1 * | 10/2006 | Hughes et al. | 375/345 |
| 2008/0062039 A1 * | 3/2008 | Cohen et al. | 342/357.01 |
| 2008/0084345 A1 * | 4/2008 | Rougas et al. | 342/14 |
| 2008/0084940 A1 * | 4/2008 | Hou | 375/260 |
| 2008/0130712 A1 * | 6/2008 | Chava et al. | 375/130 |
| 2008/0242339 A1 * | 10/2008 | Anderson | 455/522 |
| 2008/0285674 A1 * | 11/2008 | Tseng et al. | 375/267 |
| 2009/0046764 A1 * | 2/2009 | Manzi | 375/139 |
| 2009/0185642 A1 * | 7/2009 | Razzell | 375/340 |
| 2010/0026548 A1 * | 2/2010 | Weissman et al. | 342/17 |
| 2010/0026549 A1 * | 2/2010 | Weissman et al. | 342/17 |
| 2010/0283656 A1 * | 11/2010 | Zavrel et al. | 342/14 |

FOREIGN PATENT DOCUMENTS

| | | |
|---|---|---|
| CN | 1711700 A | 12/2005 |
| EP | 1300957 A1 | 4/2003 |
| EP | 1772968 A2 | 4/2007 |
| JP | 2008535376 A | 8/2008 |
| TW | 200415846 | 8/2004 |
| TW | 200627120 | 8/2006 |
| TW | 200826580 | 6/2008 |
| WO | WO2004047323 | 6/2004 |

OTHER PUBLICATIONS

Taiwan Search Report—TW098125988—TIPO—Sep. 24, 2012.

* cited by examiner

——— High sensitivity mode -1
- - - - High linearity mode -2

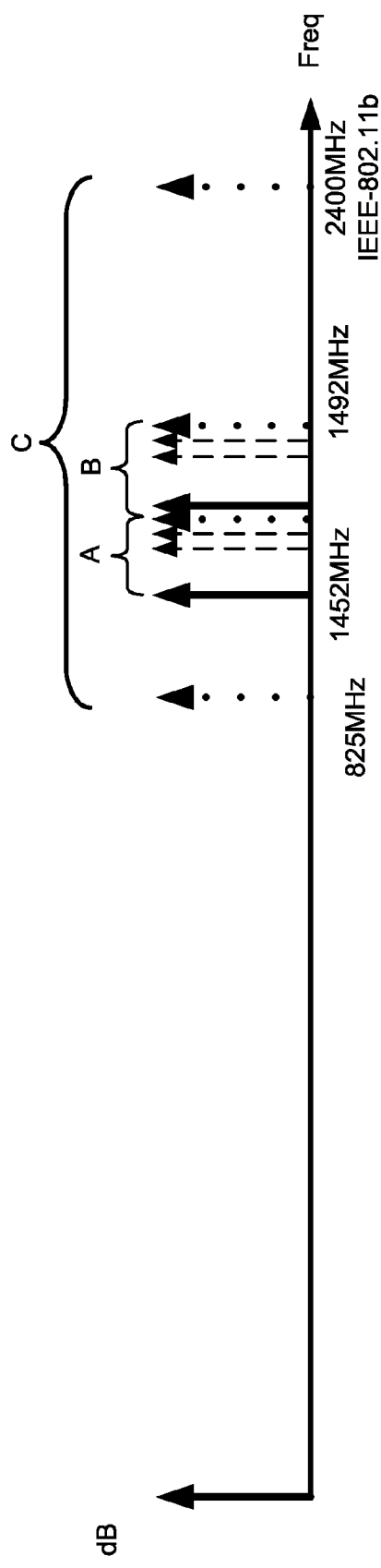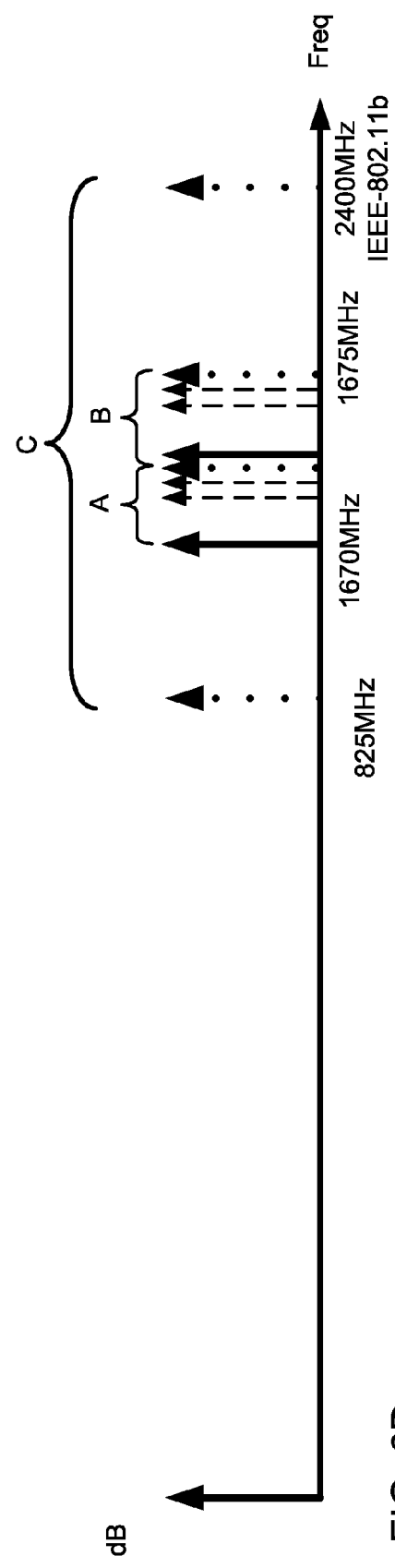
FIG. 6C
FIG. 6D

METHOD AND APPARATUS FOR PROVIDING JAMMER DETECTION IN A RECEIVER

CLAIM OF PRIORITY UNDER 35 U.S.C. §119

The present Application for Patent claims priority to Provisional Application No. 61/085,325 entitled Method and Apparatus for Providing Jammer Detection In A Receiver filed Jul. 31, 2008, and assigned to the assignee hereof and hereby expressly incorporated by reference herein.

FIELD

The present disclosure relates generally to apparatus and methods for communication receivers. More particularly the present disclosure relates to jammer detector architectures.

BACKGROUND

In a conventional communications receiver, there are two conflicting requirements: high sensitivity and high linearity. High sensitivity refers to the receiver characteristic of a low noise figure with high gain so that the receiver is sensitive to a weak signal. A low noise figure LNA provides better sensitivity to the receiver and good SNR for a weak signal. However, a low noise figure LNA with high gain fails to provide adequate SNR in the presence of strong interference (i.e., jammer) because the intermodulation level increases. The intermodulation level increase is due to the low third order intercept point (IP3) and low 1 dB compression point (P1dB) for a high sensitivity receiver.

High linearity refers to the receiver characteristic of a high third order intercept point (IP3) and a high 1 dB compression point (P1dB). A high linearity receiver has improved immunity against strong signals and against strong interferences (i.e., jammers). That is, a high linearity receiver has less distortion (e.g., intermodulation product levels, gain compression, phase non-linearity, AM-PM conversions, etc.) in the presence of strong signals or strong interferences than a high sensitivity receiver. However, a high linearity receiver (i.e., the LNA) has a higher noise figure and lower gain and therefore cannot provide optimal sensitivity and SNR in the presence of a weak jammer or if no jammer appears at all. In a particular input signal environment, to determine the appropriate characteristic of the receiver (high sensitivity versus high linearity) that is needed, a jammer detector coupled to the receiver is used. The jammer detector detects the presence of jammers. Conventional jammer detectors are typically optimized for narrowband, single band operation and do not provide both wideband and narrowband jammer detection for a multiband, multi-standard receiver over a broad frequency range.

SUMMARY

Disclosed are a method and apparatus for providing jammer detection in a receiver. In one aspect, the jammer detector for providing the jammer detection is a combination of several complementary jammer detectors, both hardware and software-based. The jammer detector incorporates a narrowband jammer detector (NB JD) to detect inband close in jammers to wanted signal, a wideband jammer detector (WB JD) to detect far off and out of band jammers, and a software jammer detector (SW JD) for detecting concurrent operation jammers. In one aspect, each of the NB JD, WB JD and SW JD has its own optimized threshold ($TH_j$). In one aspect, the jammer detector provides both wideband and narrowband jammer detection for a multiband, multi-standard, dual mode receiver over a broad frequency range.

According to one aspect, a jammer detector comprising a wideband jammer detector component for generating a wideband (WB) interrupt signal to indicate the presence of a wideband jammer; a narrowband jammer detector component for generating a narrowband (NB) interrupt signal to indicate the presence of a narrowband jammer; and an interrupt logic module for generating a composite interrupt signal based on at least one of the WB interrupt signal and the NB interrupt signal.

According to another aspect, a device for detecting a jammer comprising a wideband jammer detector for generating a wideband (WB) interrupt signal to indicate the presence of a wideband jammer; a narrowband jammer detector for generating a narrowband (NB) interrupt signal to indicate the presence of a narrowband jammer; an interrupt logic module for generating a composite interrupt signal based on at least one of the WB interrupt signal and the NB interrupt signal; and means for detecting a concurrent operation jammer from a transmitter.

According to another aspect, a wireless communication unit for jammer detection comprising a plurality of receivers for at least one of a plurality of applications; a plurality of transmitters for at least one of the plurality of applications; a wideband jammer detector for generating a wideband (WB) interrupt signal to indicate the presence of a wideband jammer; a narrowband jammer detector for generating a narrowband (NB) interrupt signal to indicate the presence of a narrowband jammer; an interrupt logic module for generating a composite interrupt signal based on at least one of the WB interrupt signal and the NB interrupt signal; a software-based jammer detector for detecting a concurrent operation jammer from one of the plurality of transmitters; and a central software based mechanism for sending a notification of the concurrent operation jammer to at least one of the plurality of receivers.

According to another aspect, a computer-readable medium storing a computer program, wherein execution of the computer program is for: sampling an input signal to generate a sampled input signal; downconverting the input signal to generate a downconverted input signal; sampling the downconverted input signal to generate a sampled downconverted (SD) input signal; comparing the sampled input signal to a wideband threshold $TH_{WB}$, and comparing the SD input signal to a narrowband threshold $TH_{NB}$; generating a wideband (WB) interrupt signal based on the comparison to the $TH_{WB}$, and generating a narrowband (NB) interrupt signal based on the comparison to the $TH_{NB}$; and generating a composite interrupt signal based on one or more of the WB interrupt signal or the NB interrupt signal.

According to another aspect, a method for detecting a jammer comprising sampling an input signal to generate a sampled input signal; downconverting the input signal to generate a downconverted input signal, and sampling the downconverted input signal to generate a sampled downconverted (SD) input signal; comparing the sampled input signal to a wideband threshold $TH_{WB}$, and comparing the SD input signal to a narrowband threshold $TH_{NB}$; generating a wideband (WB) interrupt signal based on the comparison to the $TH_{WB}$, and generating a narrowband (NB) interrupt signal based on the comparison to the $TH_{NB}$; and generating a composite interrupt signal based on one or more of the WB interrupt signal or the NB interrupt signal.

It is understood that other aspects will become readily apparent to those skilled in the art from the following detailed description, wherein it is shown and described various aspects by way of illustration. The drawings and detailed description are to be regarded as illustrative in nature and not as restrictive.

BRIEF DESCRIPTION OF THE DRAWINGS

FIGS. 6a-6d illustrate examples of jammer frequency maps.

DETAILED DESCRIPTION

Figure 1A:
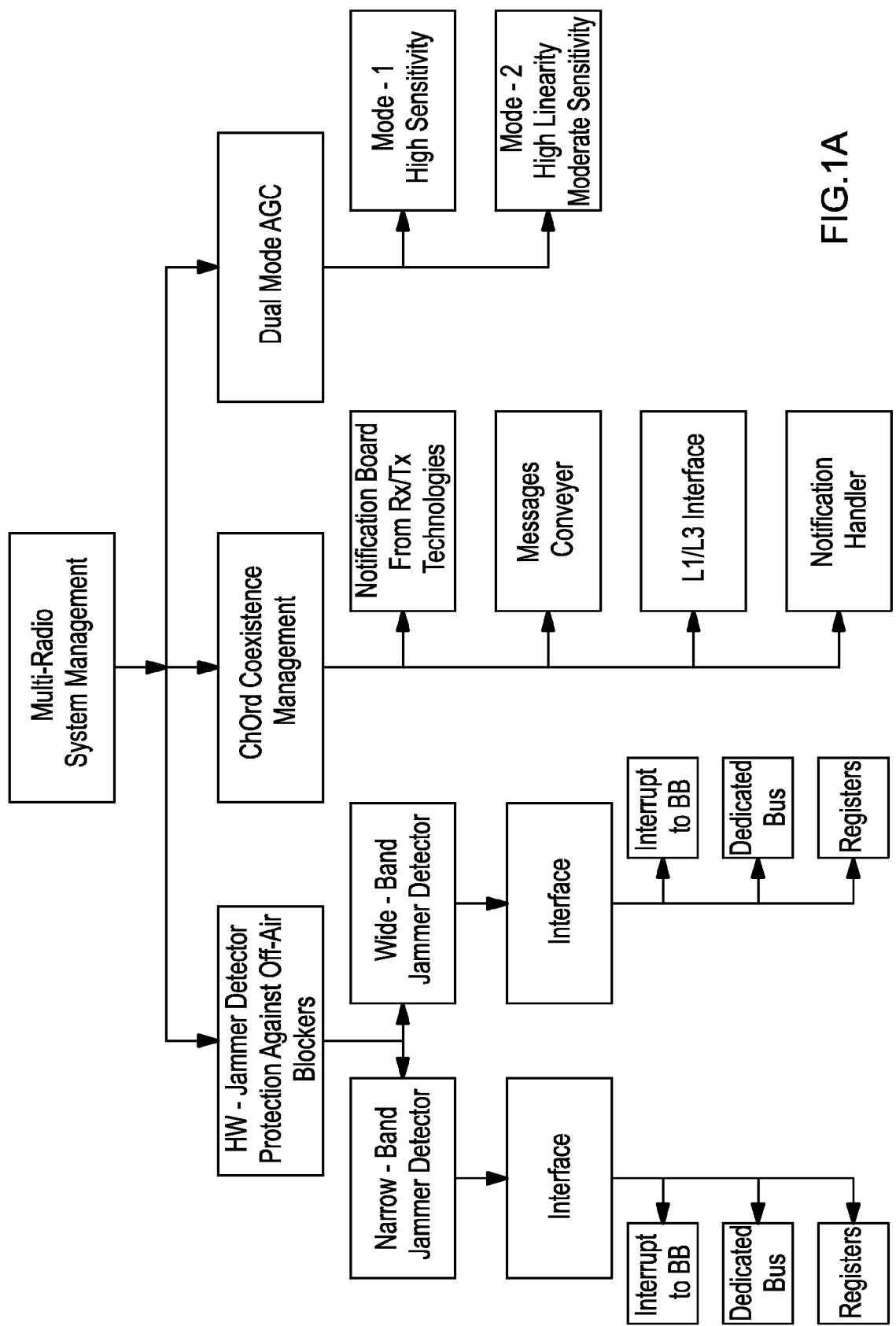
FIG. 1a illustrates an example coexistence management system.

The detailed description set forth below in connection with the appended drawings is intended as a description of various aspects of the present disclosure and is not intended to represent the only aspects in which the present disclosure may be practiced. Each aspect described in this disclosure is provided merely as an example or illustration of the present disclosure, and should not necessarily be construed as preferred or advantageous over other aspects. The detailed description includes specific details for the purpose of providing a thorough understanding of the present disclosure. However, it will be apparent to those skilled in the art that the present disclosure may be practiced without these specific details. In some instances, well-known structures and devices are shown in block diagram form in order to avoid obscuring the concepts of the present disclosure. Acronyms and other descriptive terminology may be used merely for convenience and clarity and are not intended to limit the scope of the disclosure.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

The present disclosure describes a very wideband jammer detection (JD) hardware architecture which protects a very wideband receiver from off-air jammers. In one example, the wideband jammer detector covers a jammer spectrum of at least 4 octaves. A narrowband jammer detector (NB-JD) implemented in the analog baseband circuitry protects against close-in jammer effects such as gain compression and second order intermodulation (IMR2) from jammers that are out of band of the NB-JD. The jammers that are out of band of the NB-JD create third order intermodulation (IMR3) products with jammers that are detected by the NB-JD. A wideband jammer detector (WB-JD) implemented in the receiver front end circuitry protects against inband off-air jammers which are far beyond the NB-JD capability. The NB-JD protects a very wideband receiver against very high power jammers that might generate IMR3 products within the receive band. The NB-JD protects the receiver against jammers that are above its operational BW (bandwidth) by detecting jammers within its detection BW that can generate IMR3 and cross modulation with jammers that are out of its detection BW. In one aspect, the present disclosure describes utilizing two independent thresholds, one for the NB-JD and the another for the WB-JD to optimize the receiver's high sensitivity mode of operation under the following scenarios:

Adjacent jammers and jammers in the analog baseband bandwidth which cause gain compression and cross-modulation will trip the NB-JD at a lower threshold compared to a WB-JD. In other words, the value of a wideband threshold ($TH_{WB}$) is greater than the value of a narrowband threshold ($TH_{NB}$).

Far off jammers which might generate IMR3 products will trip the WB-JD at a higher threshold compared to a NB-JD.

Usage of two separate sets of jammer detectors (JDs) protects the receiver more optimally compared to using a single threshold and a single jammer detector (JD). The usage of two JDs results in better sensitivity, better linearity and higher efficiency.

In one aspect, the wideband threshold ($TH_{WB}$) and/or the narrowband threshold ($TH_{NB}$) is selected to optimize the time of a receiver in the highest gain state G0. In one example, the receiver comprises the jammer detectors.

In addition, in one aspect, the present disclosure implements a software based jammer detector (SW-JD) 230 (shown in FIG. 2) which enables full multi-radio coexistence management with a modular approach of adding radio notifications. The SW-JD provides information regarding expected concurrent transmissions and transfers the receiver into a protected mode based on transmission power, frequency, and duration. The SW-JD also informs the receiver's management software of the concurrent transmission parameters. Based on the parameters, the SW-JD switches the receiver SRM (single-ended resistive mixer) mixer to HRM (harmonic reject mixer/harmonic mixer) mixer as an example to mitigate spurious signals and protect the receiver from second order intermodulation (IM2) products. The SW-JD also informs the rest of the receiver about a receiver-initiated silence request. For example, a GPS receiver may ask all other radios to suspend their activities so that it may perform receiver acquisition. The SW-JD may also operate as a power management integrated circuit (PMIC) sniffer to detect transmission events and monitor power consumption.

In one aspect, the hardware JD interface enables a configurable interface between the JD and the baseband circuitry which defines the interruption source and jammer type. For example, each JD has its own interrupt line, both JDs share the same interrupt, and each JD has its own status bit. The hardware JD interface also enables automatic updates of thresholds based on (serial bus interface) SBI code for gain state and JD status, which saves SBI write operations.

The receive/transmit mapping is based on location using a SW-JD kiosk. In one aspect, a software kiosk provides information to users without permitting modification of the information. The software kiosk maps all transmission power of all concurrent transmissions based on location using the GPS receiver data. It maps all receiver levels of all concurrent receivers and the actual protected receiver based on location using the GPS receiver data. It also maps all power consumption based on all receive/transmit activities based on location using the GPS receiver data. Finally, it maps the operational mode based on all receive/transmit activities based on location using the GPS receiver data. In other aspect the receive/transmit mapping is used in the receive spectrum, transmit spectrum and power consumption as function of receive/transmit location. In other aspect the receive/transmit mapping can be used by operators to evaluate field trials by fetching the data from the receive/transmit unit via the data service channel and conduct a user profile experiment.

FIG. 1a illustrates an example coexistence management system. As shown in FIG. 1a, the various system management software interfaces with the hardware jammer detector interfaces, the coexistence management software, and the dual mode automatic gain control (AGC) software.

A dual mode receiver toggles between two modes. In one aspect, the two modes include a high sensitivity mode (mode 1) and a high linearity mode (mode 2), and the dual mode receiver toggles between these two modes depending on the input signal environment. If the dual mode receiver is in high sensitivity mode, it may need immediate protection when a strong jammer appears. In one example, such protection is implemented using a fast attack automatic gain control (AGC) circuit. Fast attack refers to a property of the AGC circuit or algorithm which is a rapid gain reduction after the appearance of a strong input signal level (e.g., jammer). Then, when the strong jammer disappears, the dual mode receiver may require a slow release AGC circuit or algorithm to avoid fast toggling between the two modes. Slow release refers to a property of the AGC circuit or algorithm which is a slow gain increase after the disappearance of a strong input signal level (i.e., the strong jammer).

In conventional receiver designs, the AGC mode of operation is triggered by a single jammer detector (JD) designed for narrowband operation over a single radio frequency (RF) band. However, in many wireless scenarios, there are several interfering transmitters operating at various frequency bands, transmit power levels, and modulation schemes. A single jammer detector is not optimal for detecting a variety of jammers over a very wide bandwidth. Yet, there is a need to protect the receiver against all jammers present in the wideband environment.

Figure 1B:
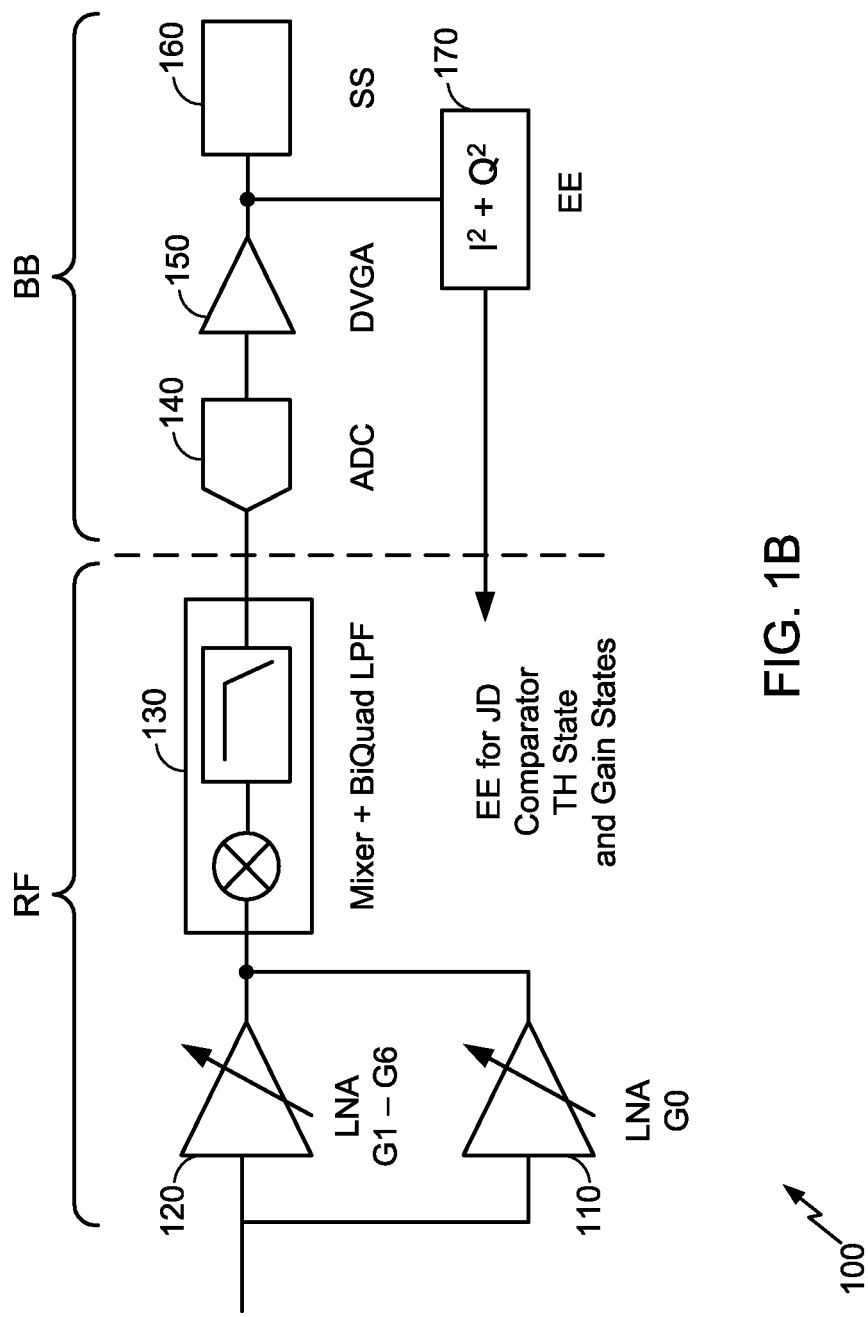
FIG. 1b illustrates an example of a dual mode receiver.

FIG. 1b illustrates an example of a dual mode receiver 100. For the dual mode receiver, mode 1 has high sensitivity and low linearity characteristics. Mode 2 has high linearity and moderate sensitivity characteristics. Mode 1 employs an LNA with low noise figure, high gain, and low current consumption. Mode 1 is used when a low level jammer or no jammer is present at the receiver input. Mode 2 employs an LNA with lower gain, higher IP3, higher current consumption and lower noise figure. Mode 2 is used when a strong jammer is present in the dual mode receiver input. The transition between the two modes is implemented by an automatic gain control (AGC) circuit or algorithm 220 triggered by a JD Read block 210 which are shown in FIG. 2.

In one example, an input RF signal is captured by a receive antenna (not shown) coupled to the dual mode receiver and is sent to the inputs (110, 120 respectively) of both mode 1 LNA and mode 2 LNA for low noise amplification and production of the mode 1 output RF signal and mode 2 output RF signal, respectively. Mode 1 LNA has input 110, and Mode 2 LNA has input 120 as shown in FIG. 1b. The AGC circuit 220 provides a mechanism (not shown) to select between the mode 1 output RF signal and the mode 2 output RF signal to yield a selected output RF signal. One skilled in the art would understand that various mechanisms known in the field can be used to select the modes without affecting the spirit and scope of the present disclosure.

The selected output RF signal is sent to the mixer/low pass filter (LPF) 130 for frequency downconversion and production of the input baseband signal. As an example the input baseband signal is sent to the analog-to-digital converter (ADC) 140 for conversion to an input digital signal. The input digital signal is then sent to a digital variable gain amplifier (DVGA) 150 for gain adjustment and production of the output digital signal. The output digital signal is then sent to the sample server (SS) module 160 for capturing the data and demodulation and also to the energy estimator (EE) 170 for estimation of the energy of the output digital signal (e.g., receiver output energy).

Figure 2:
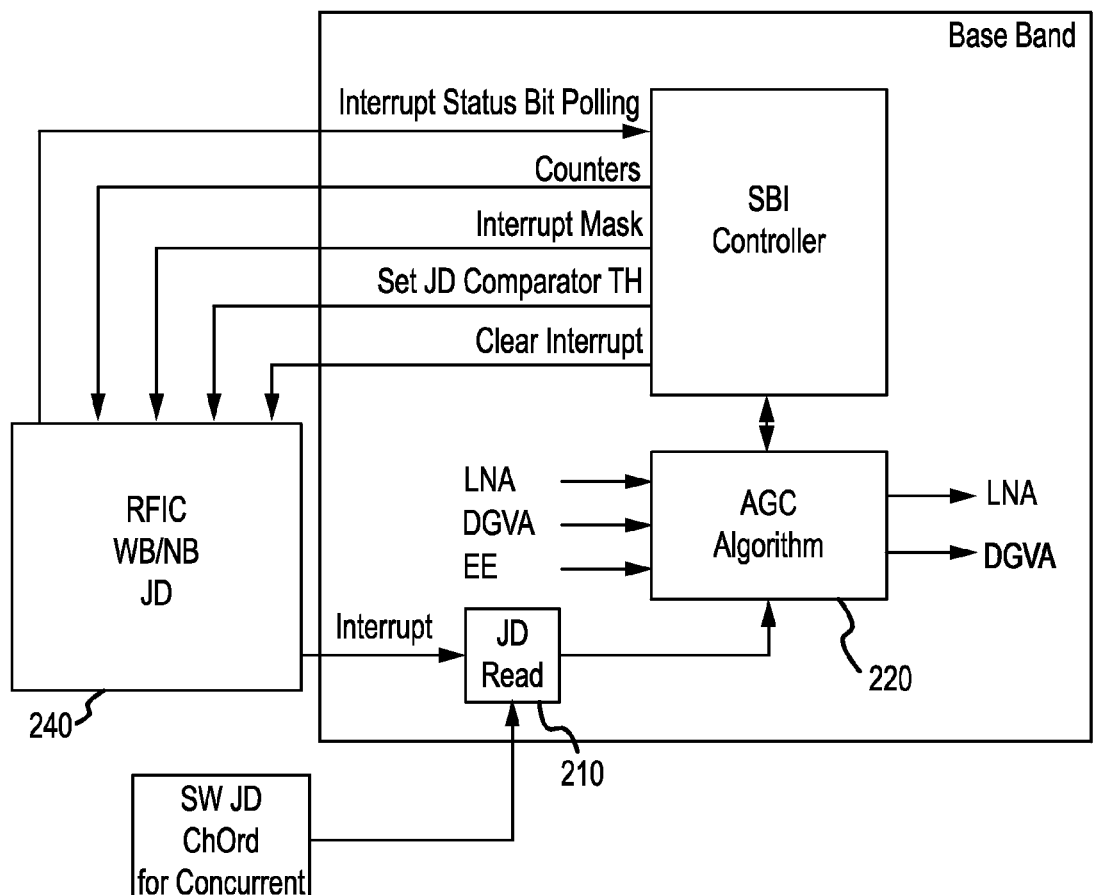
FIG. 2 illustrates an example of a block diagram of a jammer detector (JD) coupled to an automatic gain control (AGC) circuit.

FIG. 2 illustrates an example of a block diagram of jammer detector (JD) coupled to an automatic gain control (AGC) circuit. The jammer detector (JD) and the automatic gain control (AGC) circuit are coupled to the dual mode receiver 100 shown in FIG. 1b. In one aspect, the jammer detector (JD) and the automatic gain control (AGC) circuit are part of the dual mode receiver. A jammer detector input signal, which contains both the jammer and desired signal, is sent to the jammer detector (JD) for detection of a strong jammer and to produce an interrupt or interrupt status bit to the AGC algorithm or circuit. In one example, the wanted signal is the output of the energy estimator (EE) 170 (shown in FIG. 1b). The EE calculated energy level value of the wanted signal informs the AGC algorithm of the desired receiver gain states as shown by FIG. 1b items 110, 120. If the level of the jammer detector input signal exceeds a predetermined jammer detector threshold $TH_j$, a jammer detector interrupt bit is set by the JD fetched from the Read block (i.e., in one example, at the input for the dual mode AGC algorithm) 210 for either polling or interrupt modes and sent to the AGC circuit or algorithm 220. In one example, a jammer detector interrupt bit=1 means a jammer level above $TH_j$ has been detected. And, a jammer detector interrupt bit=0 means no jammer level above $TH_j$ has been detected. In one aspect, the jammer detector is a combination of a plurality of jammer detectors, each set with a predetermined jammer detector threshold $TH_j$ value. In one aspect, the jammer detector is based on several complementary jammer detectors, both hardware and software-based. The jammer detector incorporates a narrowband jammer detector (NB JD) to detect inband close in jammers, a wideband jammer detector (WB JD) to detect far off and out of band jammers, and a software jammer detector (SW JD) 230 for concurrent operation jammers. As shown in FIG. 2, the NB-JD and WB-JD are implemented into a RFIC WB/NB JD 240. Each of the NB JD, WB JD and SW JD has its own optimized jammer detector threshold ($TH_j$). In one aspect, the narrowband jammer detector, the wideband jammer detector and the software jammer detector provide jammer detection against off-air jammers and concurrent jammers.

The AGC circuit or algorithm 220 accepts the jammer detector interrupt bit, as well as the current LNA gain state, current DVGA gain state, and current EE value, as inputs to the AGC circuit. The outputs of the AGC circuit are an updated LNA gain state and an updated DVGA gain state, based on the various AGC inputs. In one example, the outputs of the AGC circuit are directed to one of the two LNAs and the DVGA 150 (shown in FIG. 1b). In one example, the AGC circuit 220 incorporates two AGC tables which govern the selection of gain states in the high sensitivity mode (mode 1) and in the high linearity mode (mode 2). In one example, if the dual mode receiver is set to mode 1 (high sensitivity mode) and the jammer detector interrupt bit is asserted HIGH (i.e., bit=1), to indicate the presence of a strong jammer, the AGC circuit 220 responds by setting the updated LNA gain state and updated DVGA gain state to their appropriate values in mode 2 (high linearity mode). In one aspect, the two AGC tables are combined as one AGC table. In another example, if the dual mode receiver is set to mode 2 (high linearity mode) and the jammer detector interrupt bit remains LOW (i.e., bit=0) for a predetermined period of time, to indicate the absence of a strong jammer for a predetermined period of time, the AGC circuit 220 sets the updated LNA gain state and updated DVGA gain state to their appropriate values in mode 1.

In one aspect, the mode 2 (high linearity mode) LNA has a plurality of gain states. In one example, the mode 2 LNA has three gain states, G1, G2, and G3, in order of decreasing gain and increasing P1dB and IP3 while compromising noise figure. Additionally, mode 2 may have other higher gain states G4, G5 and G6 and even more gain states based on application. In one aspect, in the AGC circuit, the mode 2 LNA gain state depends on the crossing of an AGC switch point. In one example, the mode 1 LNA has a plurality of gain states. One skilled in the art would understand that the quantity of gain states for mode 1 and/or mode 2 can be chosen depending on the particular application and design parameters without affecting the spirit or scope of the present disclosure.

Figure 3:
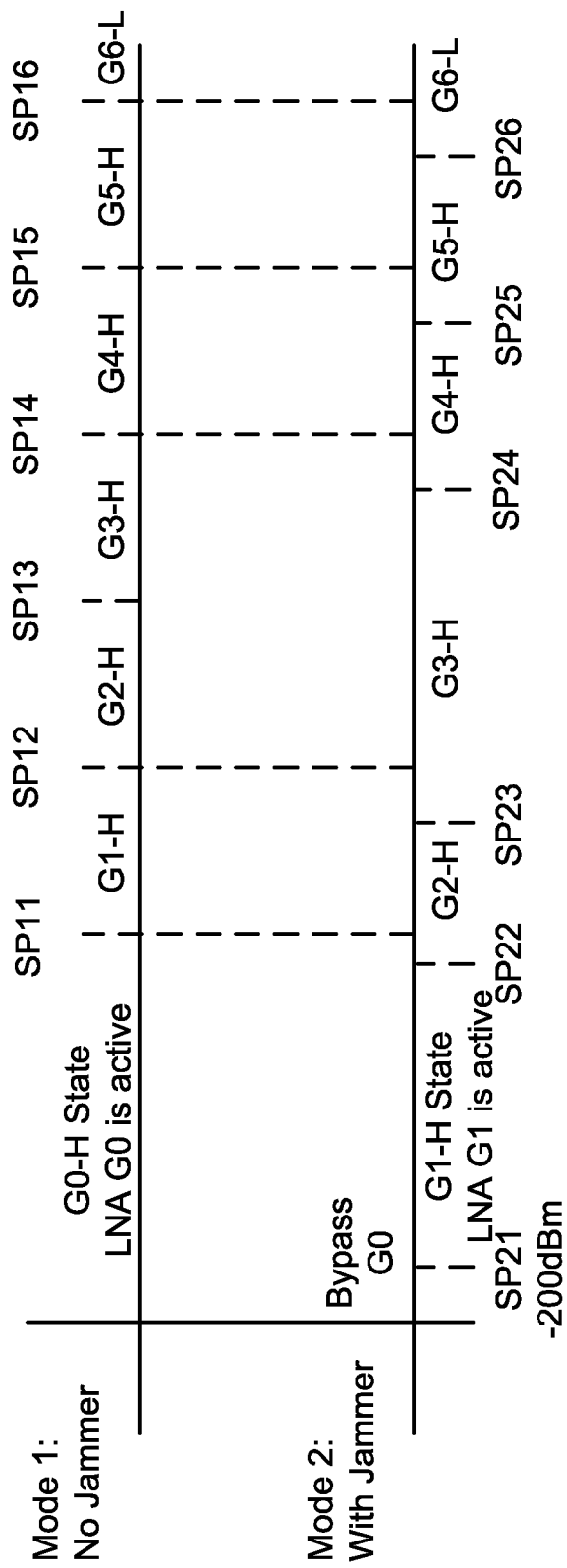
FIG. 3 illustrates an example of a state transition diagram for the dual modes in terms of switch points (SP) and gain states.

FIG. 3 illustrates an example of a state transition diagram for the dual modes in terms of switch points (SP) and gain states. Switch points are denoted as SPxy with the x value denoting the mode and the y value denoting the switch point. In FIG. 3, each mode (mode 1 and mode 2) has six switch points. Gain states are denoted as G0 through G6 for mode 1 and G1 through G6 for mode 2. G0 is bypassed in mode 2. The top line shows the state transitions for the high sensitivity mode (mode 1) and the bottom line shows the state transitions for the high linearity mode (mode 2). As shown in FIG. 3, at each switch point, a different gain state is selected.

Figure 4:
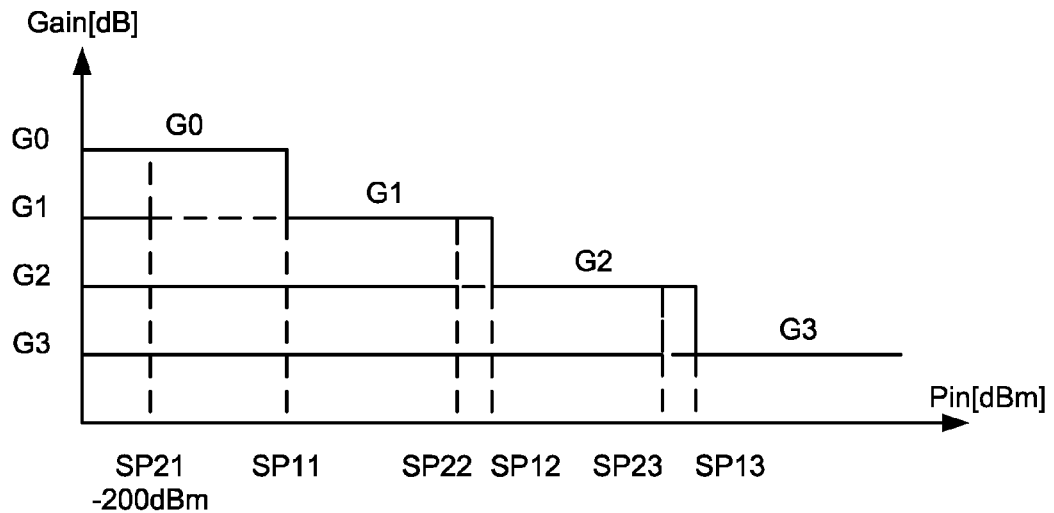
FIG. 4 illustrates an example of the resulting receiver gain states as a function of input RF level for both the high sensitivity mode (mode 1) and the high linearity mode (mode 2).

FIG. 4 illustrates an example of the resulting dual mode AGC receiver gain states as a function of input RF level for both the high sensitivity mode (mode 1) and the high linearity mode (mode 2). As shown in FIG. 4, in mode 1, the dual mode AGC receiver starts at the highest gain state G0 for low input power levels (Pin) and transitions to successive gain states (G1, G2, G3, . . . ) at corresponding switch points (SP11, SP12, SP13 . . . ) as the input power level (Pin) increases. As shown in FIG. 4, in mode 2, the dual mode AGC receiver starts at the gain state G1 for low input power levels (Pin) and transitions to successive gain states (G2, G3, . . . ) at corresponding switch points (SP22, SP23 . . . ) as the input power level (Pin) increases. Switch point SP21 for mode 2 is set at a very low input power level, for example −200 dBm, to bypass gain state G0 in mode 2.

Figure 5:
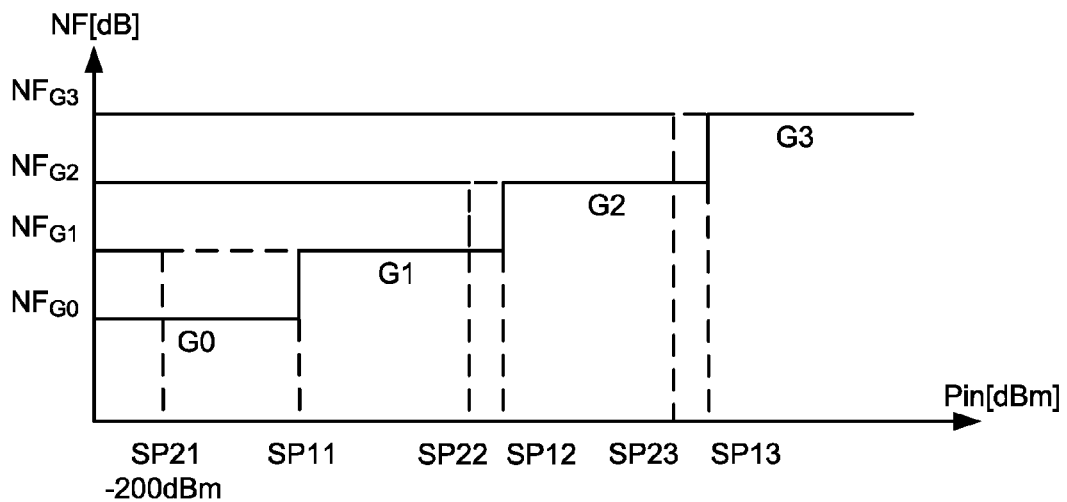
FIG. 5 illustrates an example of the resulting receiver noise figure states as a function of input RF level for both the high sensitivity mode (mode 1) and the high linearity mode (mode 2).

FIG. 5 illustrates an example of the resulting dual mode AGC receiver noise figure states as a function of input RF level for both the high sensitivity mode (mode 1) and the high linearity mode (mode 2). As shown in FIG. 5, in mode 1, the dual mode AGC receiver starts at the highest gain state G0 and the lowest noise figure $NF_{G0}$ for low input power levels (Pin) and transitions to successive gain states (G1, G2, G3, . . . ) with corresponding noise figures ($NF_{G1}$, $NF_{G2}$, $NF_{G3}$ . . . ) at corresponding switch points (SP11, SP12, SP13 . . . ) as the input power level (Pin) increases. As shown in FIG. 5, in mode 2, the dual mode AGC receiver starts at the gain state G1 and corresponding noise figure $NF_{G1}$ for low input power levels (Pin) and transitions to successive gain states (G2, G3, . . . ) with corresponding noise figures ($NF_{G2}$, $NF_{G3}$ . . . ) at corresponding switch points (SP22, SP23 . . . ) as the input power level (Pin) increases. Switch point SP21 for mode 2 is set at a very low input power level, for example −200 dBm, to bypass gain state G0 in mode 2.

Based upon the state of the jammer detector, the AGC switch points are advanced or retarded, with respect to each other as illustrated in FIG. 3. The AGC switch points affect the LNA gain states and noise figure versus the RF input power as shown in FIG. 4. At high gain states, the AGC switch points will merge in order to simplify dual mode AGC operation but it does not have to merge as a mandatory requirement. The merging characteristic depends on the output voltage level versus input power, where the output voltage level is limited to not exceed the ADC full scale reference to prevent ADC saturation. In one aspect, the values of the switch points are modified to switch earlier in the presence of a jammer. In one aspect, the values of the switch points between gain states (other than the G0 state) are adaptive based upon the jammer level.

In another aspect, the AGC switch point table is based on several parameters such as the gain compression point (to mitigate mixer nonlinearities), the ADC saturation point (to mitigate ADC nonlinearities), and the receiver third order intermodulation ratio (IMR3) (to mitigate overall carrier/noise degradation). In one example, the AGC switch points are optimized such that the receiver linearity and sensitivity requirements are met in a jammer-free environment. In the presence of jammers, the AGC switch point values are modified to cause earlier gain switching. The modified AGC switch point values may be adaptive depending on the jammer level.

Figure 6A:
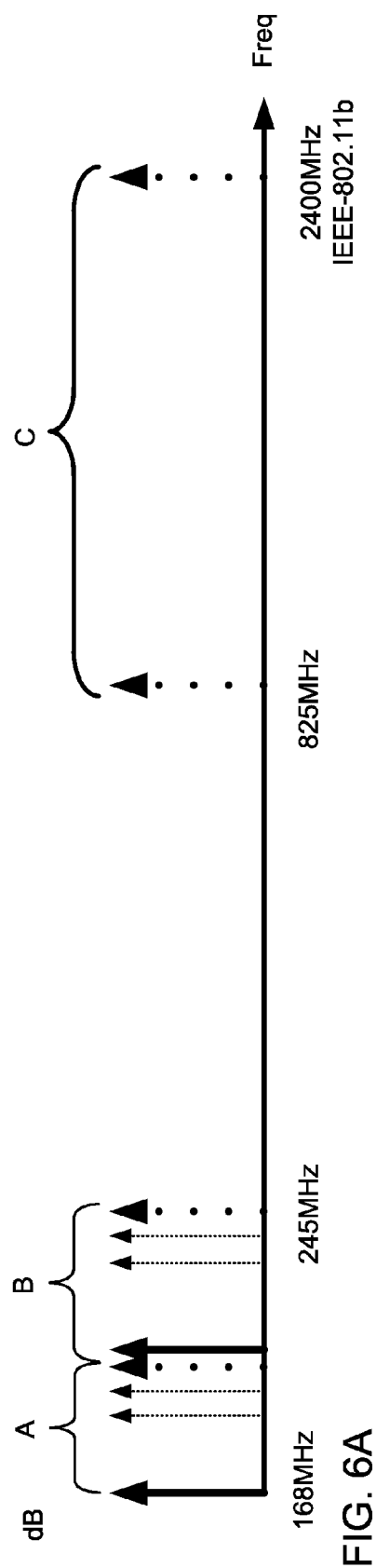
Figure 6B:
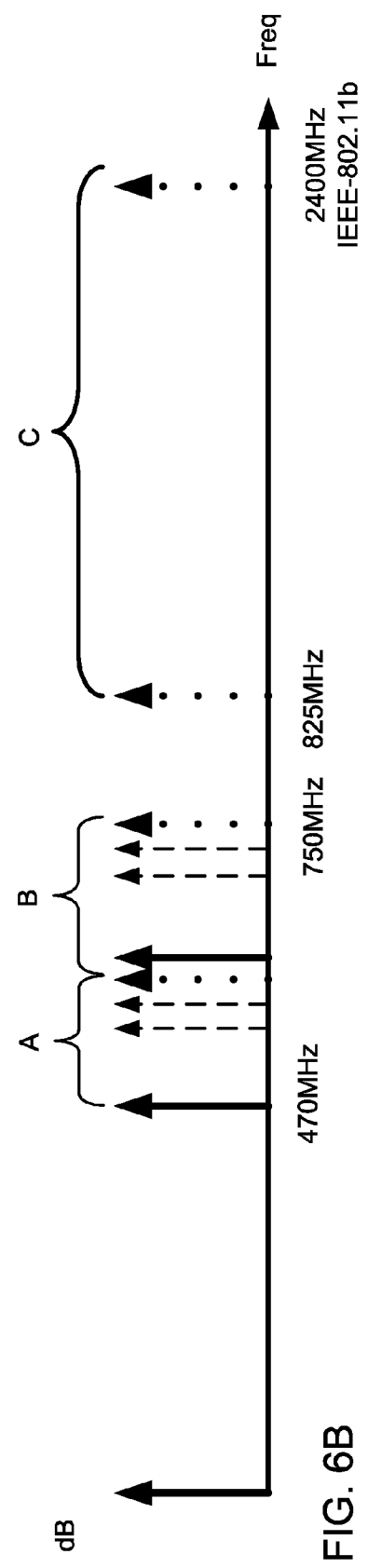

In one aspect, jammer detector profiles are defined by various radio standards. The jammer detector protects the receiver against gain compression, saturation, cross-modulation (X-MOD) and intermodulation products due to jammers by informing the AGC to change the switch point look up table to mode 2 in a fast attack process. FIGS. 6a-6d illustrate examples of jammer frequency maps showing jammer location versus frequency. FIG. 6a illustrates the jammer frequency map of VHF jammers within the RF spectrum. FIG. 6b illustrates the jammer frequency map of UHF jammers within the RF spectrum. FIG. 6c illustrates the jammer frequency map of L1 jammers within the RF spectrum. FIG. 6d illustrates the jammer frequency map of L2 jammers within the RF spectrum. In FIGS. 6a-6d, three frequency bands in the RF front end (RFEE) in which jammers appear are denoted as band A, band B and band C. Bands A and B are frequency ranges for jammer combinations that produce third order intermodulation products and gain compression. Band C is a concurrent transmitter band that produces gain compression, cross-modulation products and third order intermodulation products with band B. After down conversion to analog baseband (ABB) the jammer detector bandwidth is limited to band A only. In one aspect, band A is the bandwidth of the narrowband jammer detector (NB JD). It also represents frequencies that together with band B produce third order intermodulation products. Band A is contained within band B. In another aspect, band B is the receiver bandwidth specification defined by the radio standard. A portion of band B creates with band A intermodulation products falling within the receiver band of operation. In one aspect, if NB JD bandwidth is wider, then band A is wider. In another aspect, band C contains concurrent transmitter bands.

The condition for generating inband intermodulation products is given by equation (1).

$$f_0 = 2f_1 - f_2 \quad (1)$$

where $f_0$ is the desired frequency. Equation (1) defines the maximum frequency of band A that creates intermodulation with band B. As a consequence, if the upper limit of band A is f1, then the upper limit of band B coverage is f2. Thus the wider the NB-JD bandwidth the wider band A and the covered portion of band B is larger. Hence detection of jammers in band A protects against intermodulation products due to jammers in band B. A wider band protection against intermodulation products due to the A and B bands can be obtained with wider band jammer detection in band A. Additionally band A includes the adjacent and alternate jammers frequencies which are detected by the narrowband JD. However, band B is the remaining bandwidth which is not covered by the NB JD even though detection of jammers in band A protects against intermodulation products due to jammers in band B.

In one aspect, the design goal is to maintain the intermodulation level 16 dB below the noise level at the receiver input as an example. If the jammer detector detects the jammers in band A, it is also protected against the jammers in portions of band B as well since IMR3 products are avoided. This jammer detection and protection is due to the intermodulation mitigation for bands A and B. However, in some cases, jammers are present at band B only, or in other cases, jammers are at the higher portion of band B which is not covered by the intermodulation formulation due to the narrow bandwidth limitation of the NB JD. Two cases in band B for jammer detection are: a) when there is no jammer in band A but there is a jammer in a higher frequency portion of band B (where intermodulation is not created by bands A and B); and b) when there is no jammer in band A but there is a jammer within band B that can create intermodulation products with band A. In this latter case, since there is no jammer in band A, there is no jammer protection against the jammer in band B. For this case, there is a need for WB-JD and WB-JD is implemented.

Frequency bands of band C represent the concurrency frequencies such as cellular radio and various other transmit applications such as Global System for Mobile Communications (GSM), wideband code division multiple access (WCDMA), Bluetooth (BT), IEEE 802.11, etc. which cause gain compression, cross-modulation, or intermodulation products over a wide range of band B in UHF. This concurrent frequency transmission may be generated internally by concurrent transmitters or might be received by the antenna (not shown) coupled to the dual mode receiver.

In one example, the jammer detector supports all applicable standards and frequency bands such as: VHF 168 MHz-245 MHz; UHF 470 MHz-750 MHz; L bands that are categorized by two sub-bands, L1 of 1452 MHz-1492 MHz and L2 of 1670 MHz-1675 MHz (USA).

Table 1 illustrates an example of band definitions for defining jammer coverage. As shown in Table 1 an L band system naturally operates within the concurrency domain defined by band C. Additionally band B and band C may create IMR products for instance 2×700 MHz-1400 MHz. Band A is the band edge of the NB JD shown in the radio frequency (RF) band and follows the local oscillator (LO) setting. Band B is defined as the standard band of operation of the receiver and contains band A. LO setting in this example is the lower frequency for each operation band.

TABLE 1

| Band Domain [MHz] | NB JD BW [MHz] | LO setting Received channel f₀ [MHz] | Band A coverage RF [MHz] | Band B coverage RF [MHz] | Uncovered portion of band B RF [MHz] | Band C coverage RF [MHz] |
|---|---|---|---|---|---|---|
| VHF 168-245 | 36 | 168 | 168-204 | 204-240 | 5 | None |
| UHF 470-750 | 36 | 470 | 470-506 | 506-542 | 208 | None |
| L1 1452-1492 | 36 | 1452 | 1452-1488 | 1488-1524 | None uncovered | 1452-1524 |
| L2 1670-1675 | 36 | 1670 | 1670-1706 | 1706-1742 | None uncovered (by NB JD) | 1670-1742 |

Figure 7A:
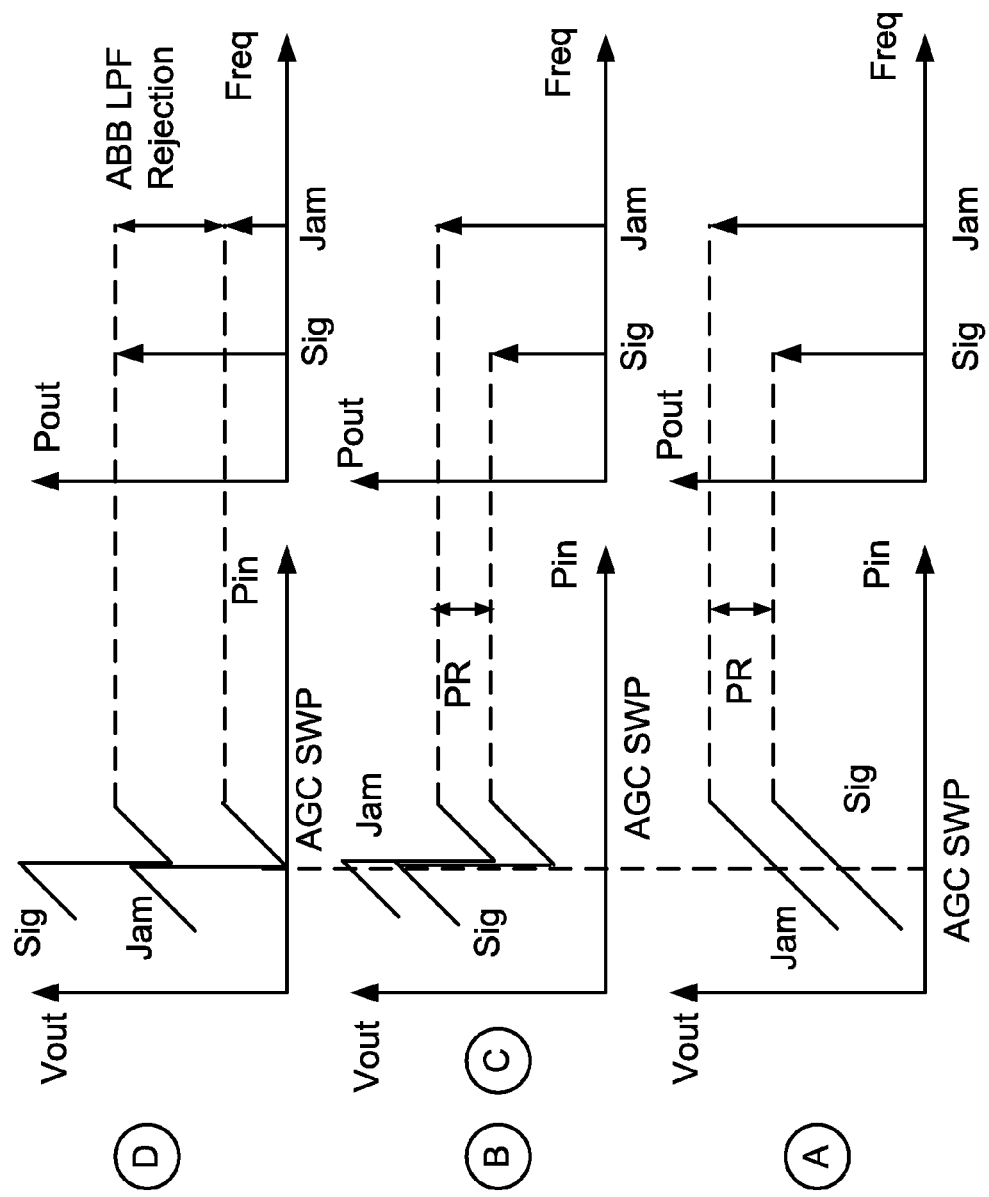
FIG. 7a illustrates the output voltage (Vout) versus input power (Pin) of the wanted signal and the jammer signal as function of frequency response of the receiver at different points in the receive chain and output power (Pout) of the wanted signal and the jammer versus frequency as function of frequency response of the receiver at different points in the receive chain with the jammer detector hardware as shown in FIG. 7b.
Figure 7B:
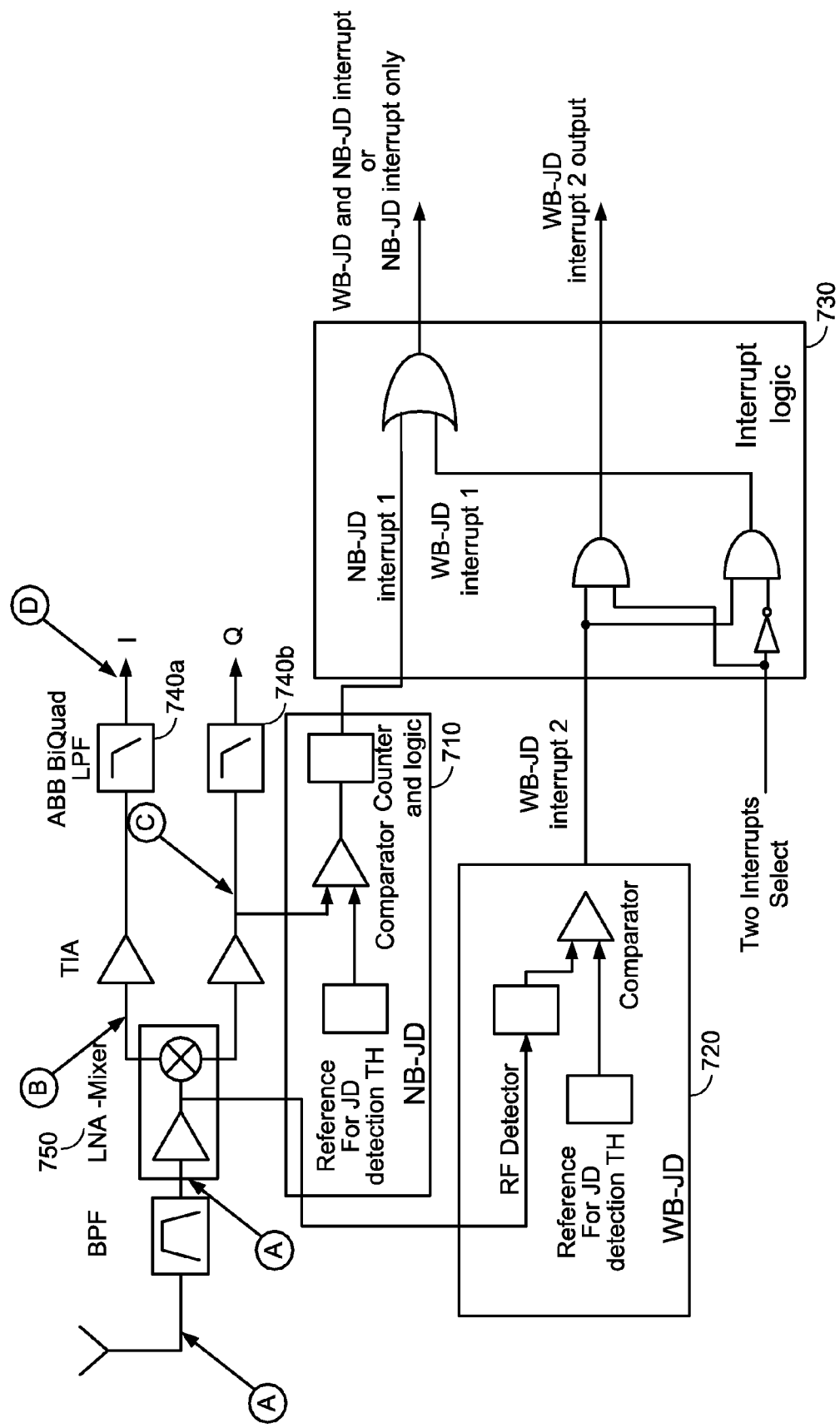
FIG. 7b illustrates an example of a hardware implementation of a jammer detector with a wideband jammer detector (WB JD) component and a narrowband jammer detector (NB JD) component and its interrupt logic showing combined interrupt or dedicated interrupt report for each JD.

Table 2 illustrates an example of definitions for band A, B and C for a multi band receiver such as the dual mode AGC receiver 100. The covered portion of band B against intermodulation products is within LO±36 MHz to LO±72 MHz, since the operational bandwidth of the NB JD is 36 MHz and detection of a jammer by the NB JD protects against intermodulation products. The NB JD protects against intermodulation products for an additional 36 MHz which is LO±72 MHz. However if there are no jammers within the NB JD range of detection, LO±36 MHz, there would be no protection against intermodulation products by the NB JD in the band B range of LO±36 MHz to LO±72 MHz. Since the protection against compression nonlinearities must cover over the entire band B and band C, the jammer detector includes wideband receiver operation by implementing a WB JD as well. LO setting for this example is at any frequency within the relevant band of operation.

response of the receiver at different points in the receive chain with the jammer detector hardware as shown in FIG. 7b. The NB JD covers band A and a portion of band B in case an intermodulation condition exists, i.e., there is a jammer in band A. If the NB JD is wider, a larger portion of band B is covered. The WB JD covers bands A, B, and C. The combination of the WB JD and NB JD components provides mitigation against intermodulation products and gain compression.

In one example, the NB JD samples the zero intermediate frequency (ZIF) analog baseband signal after the mixer output which can be, for example, a transimpedance amplifier (TIA) prior the ABB LPF 740a, 740b (analog baseband low pass filter). In another example, the analog baseband signal is a non-zero intermediate frequency. In conventional superheterodyne receivers, the NB JD samples the IF signal, prior to the input of the IF bandpass filter (BPF) as an example. The

TABLE 2

| Band Domain [MHz] | NB JD BW [MHz] | LO range for Received channel f₀ [MHz] | Band A coverage RF [MHz] | Band B definition for compression and IMR3 RF [MHz] | Band B definition for IMR3 with band A RF [MHz] | Uncovered portion of band B RF [MHz] | Band C [MHz] |
|---|---|---|---|---|---|---|---|
| VHF 168-245 | 36 | 168-245 | LO ± 36 | 168-245 | LO ± 36 > f > LO ± 72 | f > LO ± 72 | 825-2400 |
| UHF 470-750 | 36 | 470-750 | LO ± 36 | 470-750 | LO ± 36 > f > LO ± 72 | f > LO ± 72 | 825-2400 |
| L1 1452-1492 | 36 | 1452-1492 | LO ± 36 | 1452-1492 | LO ± 36 > f > LO ± 72 | f > LO ± 72 | 825-2400 |
| L2 1670-1675 | 36 | 1670-1675 | LO ± 36 | 1670-1675 | LO ± 36 > f > LO ± 72 | f > LO ± 72 | 825-2400 |

In one aspect, a hardware implementation of the jammer detector comprises two components, a NB JD in the analog baseband section and a WB JD in the RF section. FIG. 7b illustrates an example of a hardware implementation of a jammer detector with a wideband jammer detector (WB JD) component 720 and a narrowband jammer detector (NB JD) component 720 with interrupt logic 730 showing combined interrupt or dedicated interrupt report for each JD. FIG. 7a illustrates the output voltage (Vout) versus input power (Pin) of the wanted signal, the jammer signal as a function of frequency response of the receiver at different points in the receive chain, output power (Pout) of the wanted signal, and the jammer versus frequency as a function of frequency sampled signal is routed to a comparator as depicted by FIG. 7. In one example, the NB JD block provides the protection against adjacent and alternate frequency bands denoted as N±1, N±2, N±3, N±4, roughly up to 4×8 MHz+4 MHz=36 MHz for band A. In another example, jammer detection within a 36 MHz range protects against intermodulation generating jammers up to a 72 MHz range for band B. However, if there are jammers beyond the 36 MHz range, and if there are no jammers in band A, the additional WB jammer detector component is needed. In one example, the LNA-mixer 750 includes different mixer types, such as but not limited to, single-ended resistive mixer (SRM) and harmonic reject mixer (HRM).

Figure 8A:
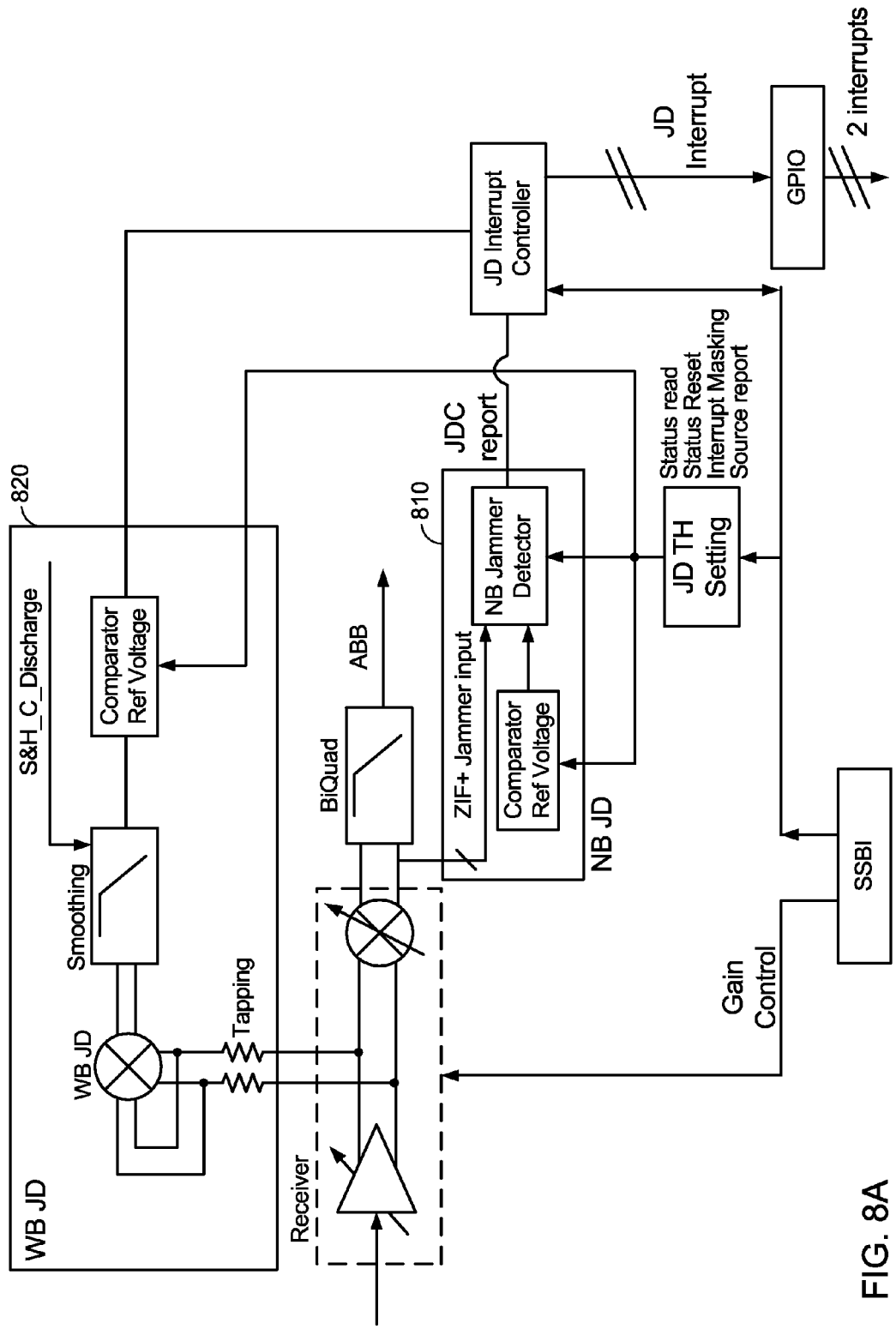
FIG. 8a illustrates an example of a hardware implementation of a jammer detector comprising a narrowband jammer detector (NB JD) component and one implementation of the wideband jammer detector (WB JD) component.

FIG. 8a illustrates an example of a hardware implementation of a jammer detector comprising a narrowband jammer detector (NB JD) component and one implementation of the wideband jammer detector (WB JD) component. The WB JD protects the receiver from gain compression, cross-modulation due to "far off" jammers with very high protection ratio and intermodulation products. The "far off" jammers cannot be detected by the NB JD because of its bandwidth limitations, for example, 36 MHz. The addition of the WB JD overcomes the bandwidth limitation of the NB JD. Furthermore, the VHF, UHF and L bands are protected for bands A, B and C. The addition of the WB JD solves the coverage problem presented in Table 1. In one example, the WB JD is implemented in hardware and covers band B, and a software jammer detector implementation covers concurrent operation in band C.

In FIG. 8a and FIG. 7b, the desired signal flow and jammer flow through the receiver is illustrated. For example, the NB JD signal sample is tapped off at the TIA output or another tap point prior to the LPF and is fed to the NB JD comparator for detection. In one example, the NB JD senses either the in-phase (I) signal component or the quadrature (Q) component or both I and Q components in a zero IF or very low IF receiver output configuration. In another example, the NB JD senses either the I signal component or the Q signal component or both I and Q components in an IF receiver output configuration prior to the IF BPF. In addition, the WB JD signal sample is tapped off at the LNA output and is fed to the WB JD RF detector and comparator for detection. The WB JD implementation in FIG. 8a is based on self mixing. The WB JD signal sample is sensed by tapping the LNA output. For sensing concurrent signals, the WB JD can tap at the LNA input rather than at the output since there is sufficient jammer power for detection by the WB JD. Another example of a WB JD implementation uses a RF power detector or any other detection method. One skilled in the art would understand that other implementations of the WB JD may be used without affecting the spirit and scope of the present disclosure.

Figure 8B:
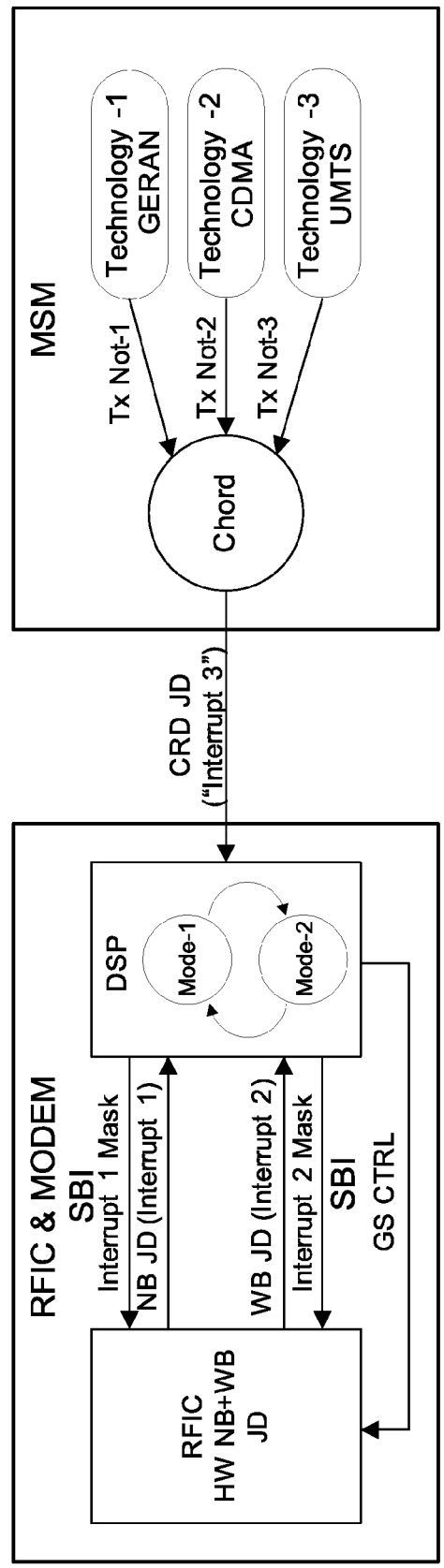
FIG. 8B illustrates an example state diagram of the jammer detector (JD).

FIG. 8B illustrates an example state diagram of the jammer detector (JD). A radio frequency integrated circuit (RFIC) hosts both hardware JDs and provides interrupt signals (NB JD and WB JD) to a digital signal processor (DSP) to indicate the presence of either a narrowband or wideband jammer, respectively, within the receive bandwidth. Conversely, the DSP provides Interrupt Mask signals to the JDs to mask the JD interrupt signals optionally. Additionally, as an example, a mobile station modem (MSM), which is compatible with three wireless technologies, Global System for Mobile Communications (GSM), Code Division Multiple Access (CDMA), and Universal Mobile Telecommunications System (UMTS), provides a third interrupt signal based on the software-based JD.

Figure 9A:
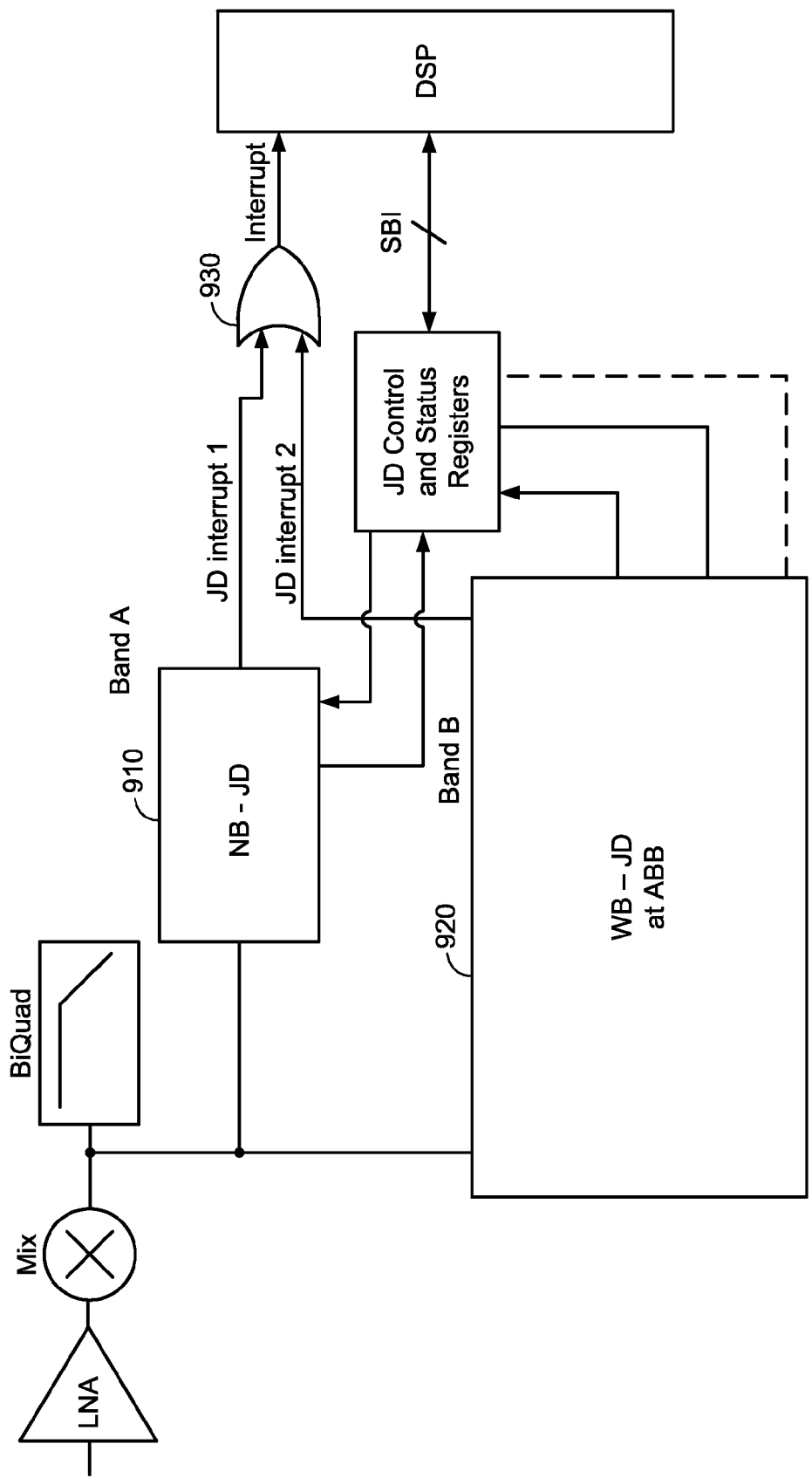
FIG. 9a illustrates an example implementation for extending detection of jammers within the receiver bandwidth.

FIG. 9a illustrates an example implementation for extending detection of jammers within the receiver bandwidth (band B). NB JD detection capability can be extended by increasing the coverage of band B. The implementation shown in FIG. 9a senses jammers above the NB JD bandwidth. The supporting detector (WB JD) covers band B at the analog baseband (ABB) section. In one example, if the NB JD covers 36 MHz, the WB JD in the ABB section includes a high pass filter which passes jammers with frequencies above 36 MHz. With the implementation of both a WB JD 920 and a NB JD 910, the jammer detector covers both band A and band B. Therefore, the intermodulation range protection is extended since there are frequencies within band B that may create intermodulation products falling in $f_0$ according to the equation (1) $f_0=2f_1-f_2$. Moreover, the resolution of detection and jammer source at the ABB section is accomplished. The implementation of a WB JD and a NB JD is advantageous over a single JD. In another example, the WB JD in the ABB section is used to cover the entire IF band. As a result, the jammer detector comprising the WB JD and NB JD components achieves a wider protection against gain compression and intermodulation degradation. JD interrupt signals from the WB JD 920 and NB JD 910 may be combined in an interrupt logic module 930. In other example, having the two JD in ABB, NB-JD and WB-JD provide additional degree of freedom for jammer thresholds and detection optimization. Having two JD in ABB and WB-JD in the RF section provides even wider and more flexible protection against jammers. As an example, protection against IMR3 (third order intermodulation) would require a different threshold compared to gain compression, as one threshold can be related to far off jammers, and the other to close in jammers. Thus, two thresholds will provide higher resolution on jammer types and effects. This will maximize the time of being in mode 1 compared to the use of a single JD with a single threshold.

In one example, the jammer detector as shown in FIGS. 7b, 8 and 9 comprises a wideband jammer detector component for generating a wideband (WB) interrupt signal to indicate the presence of a wideband jammer; a narrowband jammer detector component for generating a narrowband (NB) interrupt signal to indicate the presence of a narrowband jammer; and an interrupt logic module for generating a composite interrupt signal based on at least one of the WB interrupt signal and the NB interrupt signal. In one aspect, the WB interrupt signal includes a status signal. In another aspect, the NB interrupt signal includes a status signal. In one example, the composite interrupt signal is used for power consumption wherein optionally the power consumption is of an analog baseband low pass filter (ABB LPF).

Figure 9B:
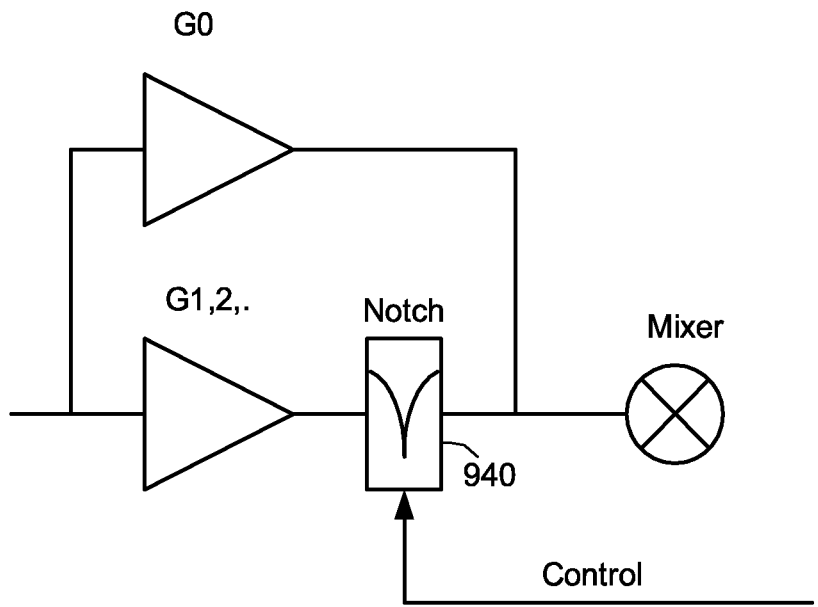
FIGS. 9b-9d illustrate examples of receiver implementations in accordance with the present disclosure.
Figure 9C:
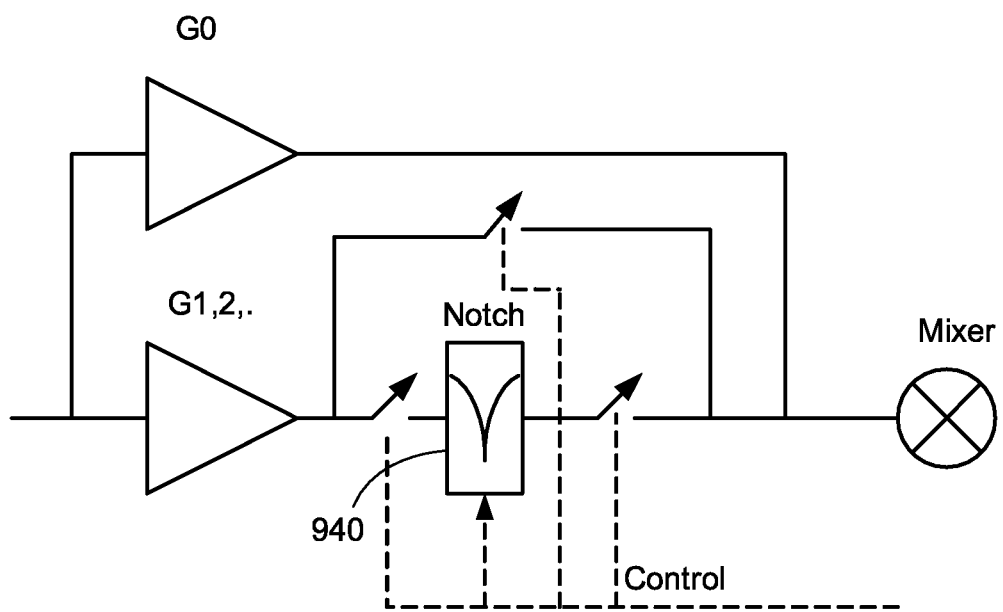
Figure 9D:
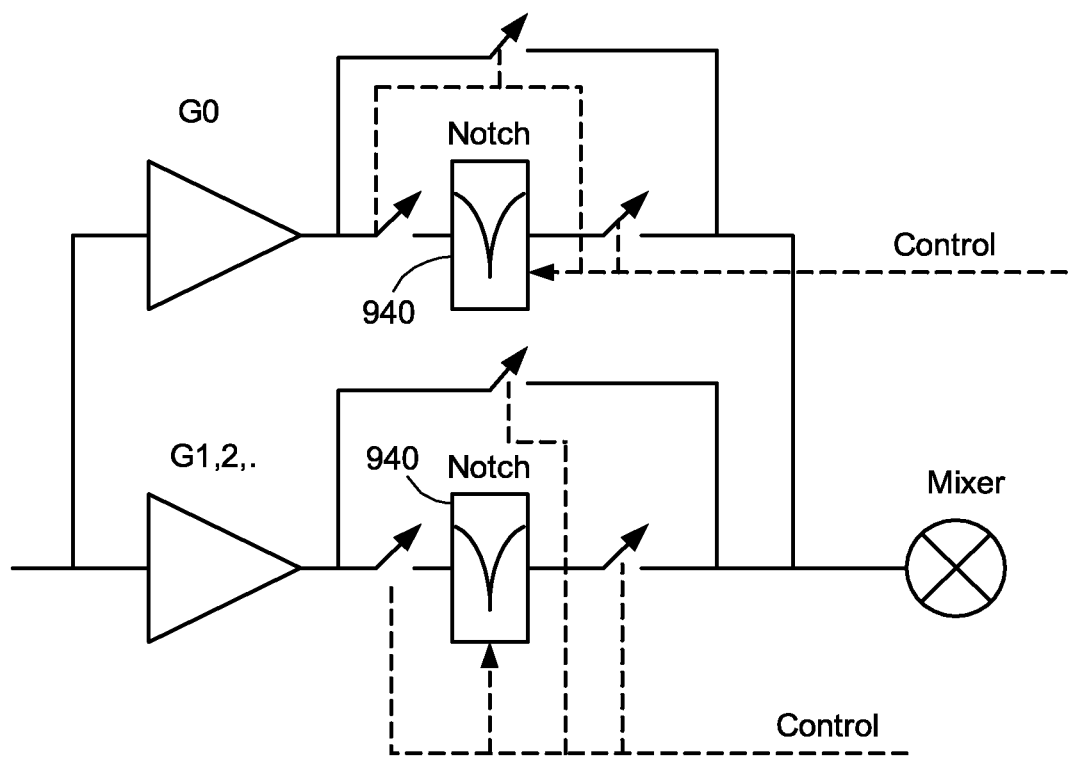

FIGS. 9b-9d illustrate examples of receiver implementations in accordance with the present disclosure. In one aspect, the receiver enhances the Mode 2 operation while it is desensitized from concurrent transmitters by incorporating notch filters 940 in the LNA path of Mode 2 as shown in FIG. 9b. The notch filter 940 rejects further the concurrent transmitter's power leakage into the receiver. Such power leakage may cause spurious products which fall within the receive band at frequencies such as:

$$f_{ABB}=5f_{LO}-3f_{Concurrent}$$

$$f_{ABB}=3f_{LO}-2f_{Concurrent}$$

In addition, the notch filter 940 mitigates other undesirable effects such as cross-modulation, high third-order intermodulation ratio (IMR3) and gain compression. In one example, the notch filter is tunable at its center frequency to optimize rejection of concurrent transmission leakage. Several notches in the frequency domain can be implemented to reject various concurrent transmitter signals in a MultiCom radio. Alternatively, these notches can be bypassed to improve the frequency response when the receiver operates in Mode 1, as shown in FIG. 9c, as an example of high sensitivity (i.e. low noise figure) and low linearity. In one example, these notches can be implemented only for gain states G1 and above to not reduce the gain and noise figure performance of the G0 gain state which is always used in Mode 1. In another example, the notches can be used in the G0 state as well to mitigate low concurrent transmission power levels in Mode 1 as illustrated in FIG. 9d. Hence, one can use notches in two sub-cases of Mode 1. In one aspect, the following notch filter usage scenarios may occur:

For no concurrent transmission, notches are bypassed in Mode 1 or Mode 2

For very low concurrent transmission, notches are bypassed in Mode 1 or Mode 2

For acceptable concurrent transmission, notches are used in the G0 state and the receiver remains in Mode 1

For strong concurrent transmission, notches are used in the G1 state and the receiver remains in mode 2

For medium concurrent transmission, notches are not used in the G1 state and the receiver remains in mode 2

In another example, the RF notch filters is implemented in the Mode 2 case only. In one example, the notch filters are activated when the SW-JD detects a concurrent transmission activity. In another example, a HW-JD with sufficient bandwidth can detect concurrent transmission activity and activate notch filters. The SW-JD may monitor concurrent transmission on a downlink and decide to activate the notch if a strong interference is received. In one example, the strong interference is defined as interference above a predetermined value. One skilled in the art would understand that the predetermined value may be based on many factors without limiting the scope or spirit of the present disclosure. In another example, the notches may be implemented permanently in Mode 2 without any notification from the SW-JD or WB-JD.

Figure 10A:
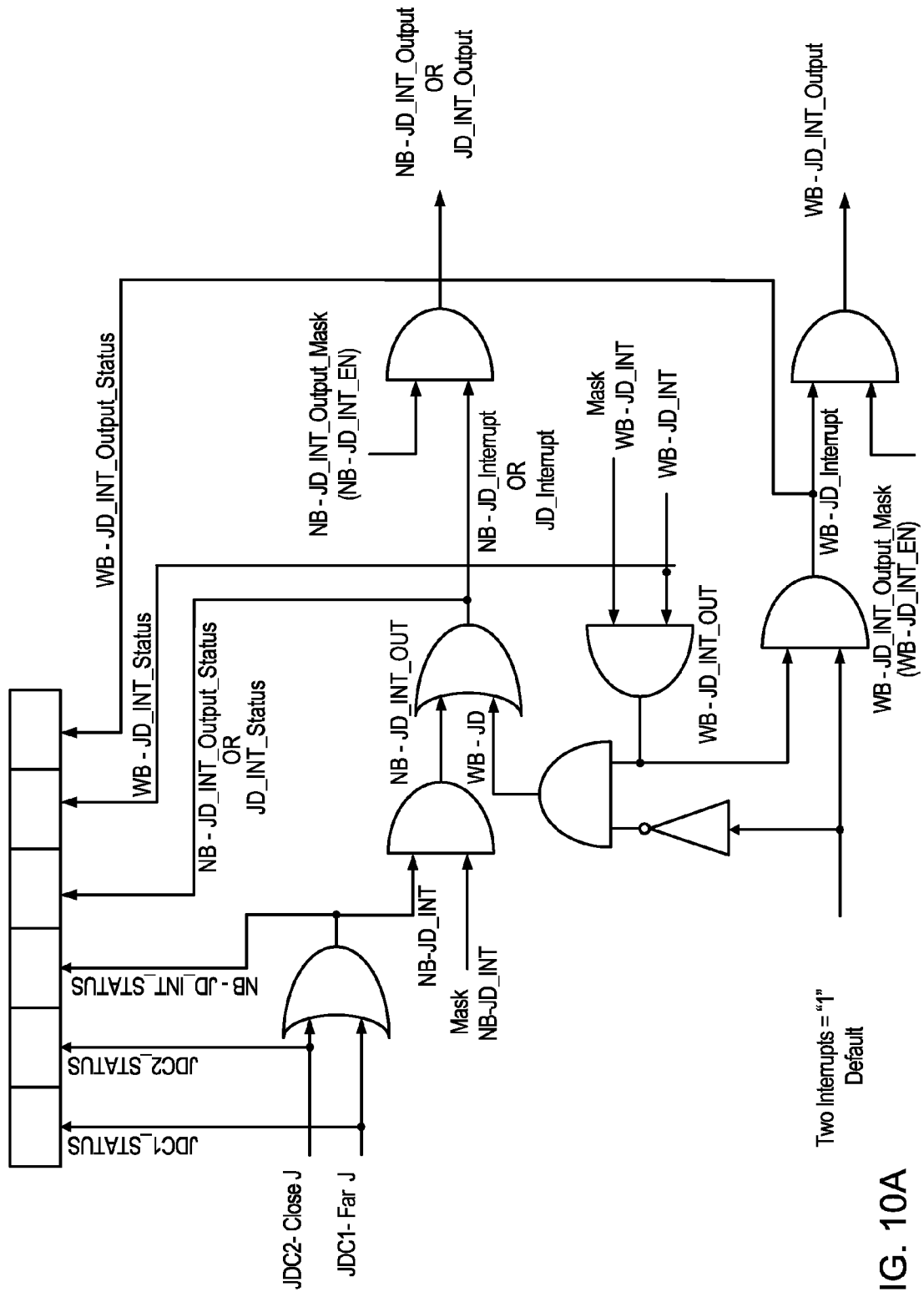
FIG. 10a illustrates an example of interrupt sources and status reporting to a jammer detector register.
Figure 10B:
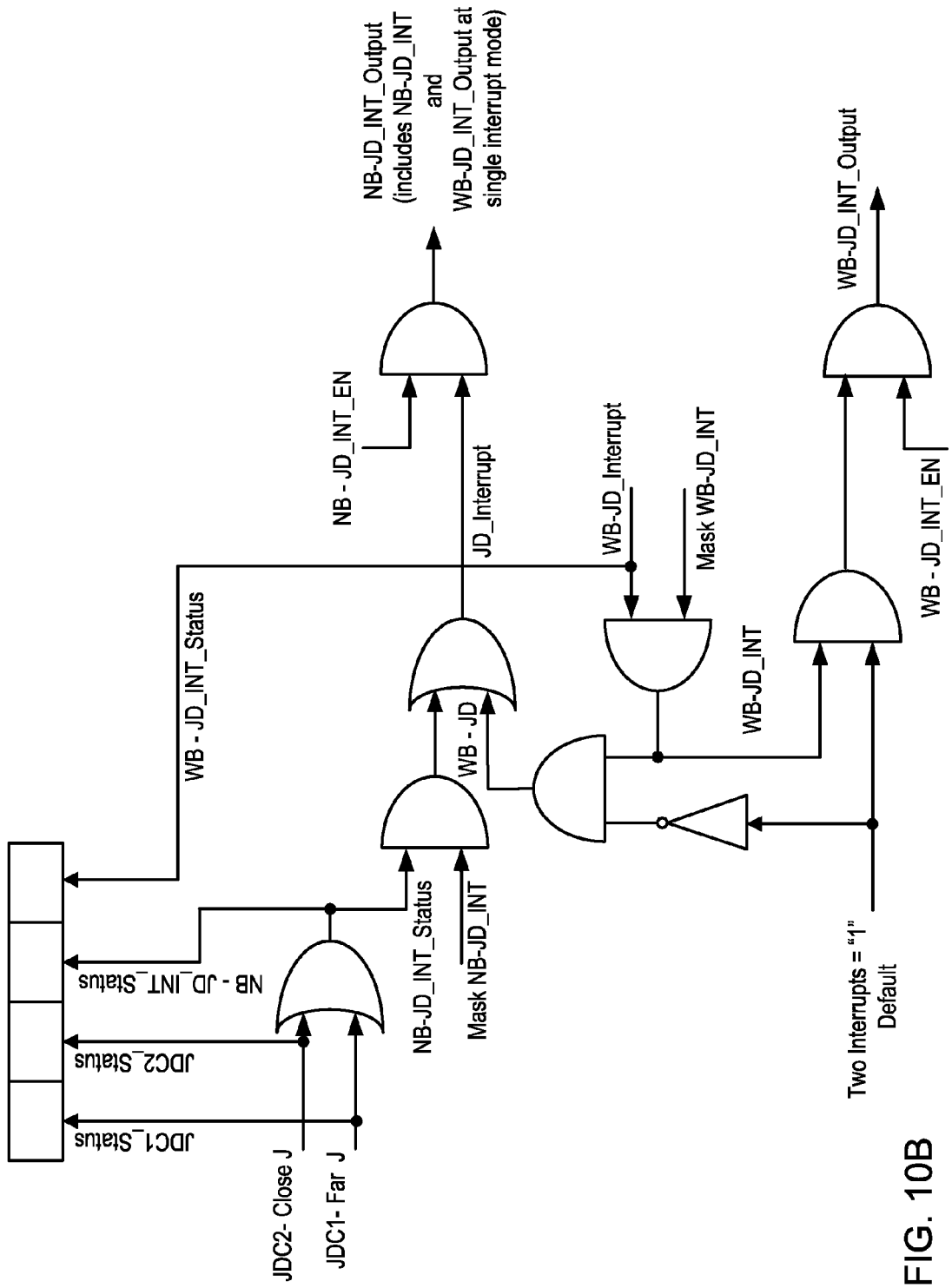
FIG. 10b illustrates another example of interrupt sources and status reporting to a jammer detector register.

FIG. 10a illustrates an example of interrupt sources and status reporting to a jammer detector register. The NB JD has a limited bandwidth to detect jammers. The WB JD is used as an additional jammer detector to support coverage of bands B and C. In one example, the setting of the thresholds for the NB JD and WB JD can be performed by a single-wire serial interface (SSBI) bus. Interrupts may generate a jammer report for fast attack process. A SSBI status read may generate a jammer detection status for slow release status read during polling as described in FIG. 10a. FIG. 10a shows an example for JD1_Interrupt_Status (JD_Interrupt_Status) and JD2_Interrupt_Status. These status signals are used by the AGC circuit or algorithm, for example, as conditions for release. The values are read during polling process. FIG. 10b illustrates another example of interrupt sources and status reporting to a jammer detector register with a simpler jammer interrupt generation tree logic.

NB JD is a limited bandwidth device to detect jammers up to, for example, a 36 MHz bandwidth. WB JD is used as jammer detector to support coverage of band B. Both jammer detectors report when tripped by a jammer. FIGS. 10a and 10b illustrate the interrupt report from both the NB JD and WB JD. The jammer interrupt logic supports two options to increase flexibility: There are two interrupts, one for narrowband detection and one for wideband RF detection in the default wakeup state. The control signal "Two Interrupts" is equal to "1" in the default wakeup state. Another option is use a single interrupt source combining both the NB JD and the WB RF JD by an OR gate. The control signal "Two Interrupts" is equal to "0" in this case. The "Two Interrupts" control signal is a masking bit. At the default state of "1", it conveys the WB JD interrupt to the WB JD interrupt port and blocks it from reaching an OR gate that sums both interrupts into a single output. In case the "Two Interrupts" control signal equals to "0", it blocks the JD2 interrupt port and enables propagation of the WB JD interrupt to be ORed with the NB-JD interrupt, creating a single JD interrupt.

Figure 11A:
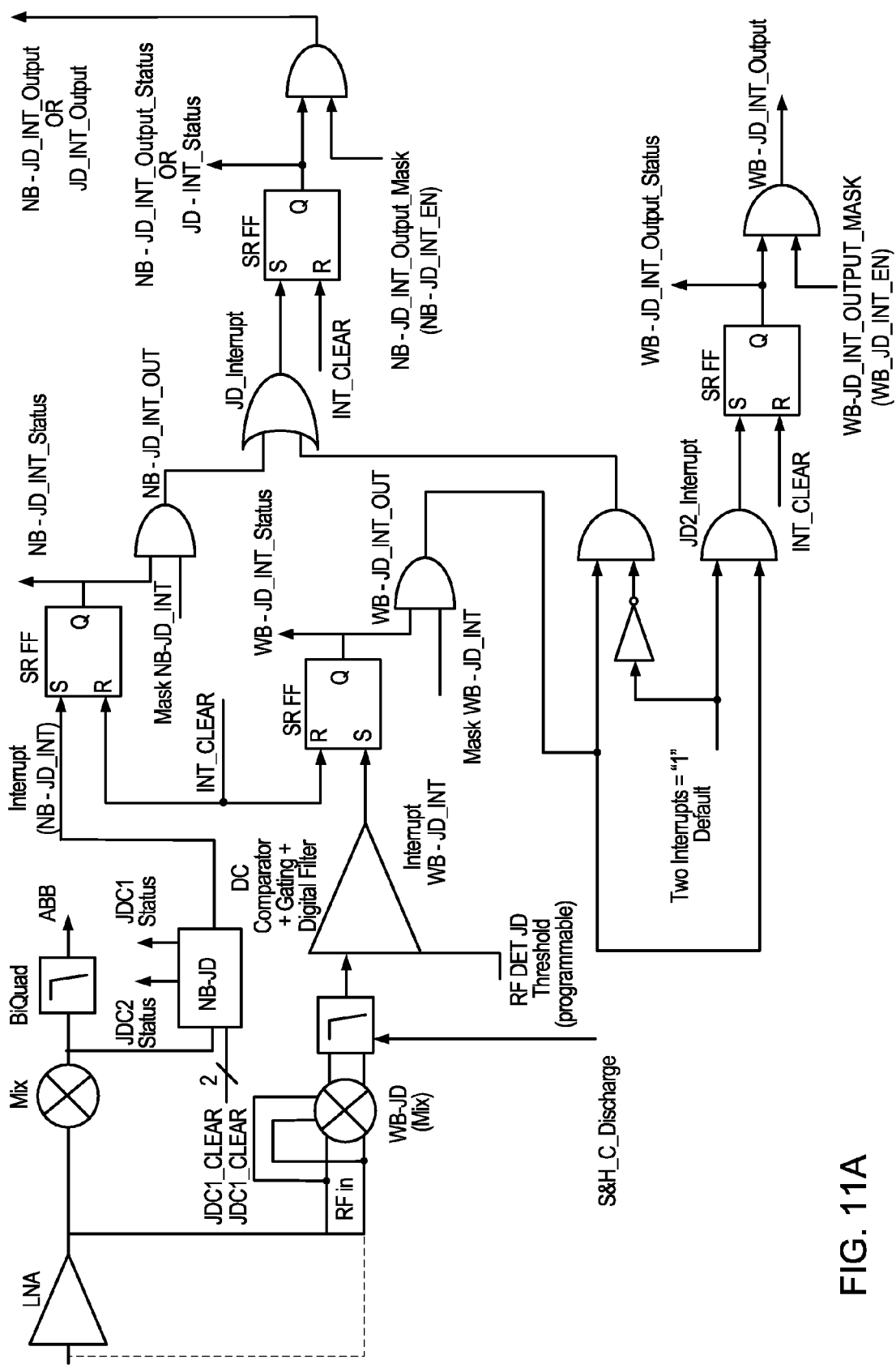
FIG. 11a illustrates an example interrupt and status report from the NB JD and WB JD.

FIG. 11a illustrates an example interrupt report and statuses generation from the NB JD and WB JD. As illustrated in the example in FIG. 11a, the logic supports two options to increase flexibility: a) Two interrupts, one for the NB JD and one for the WB JD (which in one example is a default wakeup state), controlled by the two interrupt control bit equaling to "1"; and b) A single interrupt source combining both the NB JD and the WB JD using an OR gate, controlled by the two interrupt control bit equaling to "0". The two interrupt control bit is a masking bit that defines the number of interrupt sources, one or two. At the default state of "1" the two interrupt control bit conveys the WB JD interrupt to the WB-JD_INT_Output interrupt port and blocks it from reaching an OR gate that sums both interrupts into a single output. If the two interrupt control bit equals to "0", it blocks the WB-JD_INT_Output interrupt port and enables propagation of the WB JD to be ORed with the NB JD to a single JD interrupt. The two interrupt control bit defines the operational mode between two interrupts, one for the NB JD and one for the WB JD or a single interrupt which combines the two interrupts into a single interrupt.

FIG. 11a shows an example of four set reset (SR) flip-flops to store statuses of the JD report of interrupts. The number of flip-flops can be minimized and logic can be modified. The purpose of the flip-flops is to increase flexibility and to provide more debug options for the JD reporting logic. The NB JD produces the NB-JD_INT at the Set (S) input of a dedicated SR FF. The output of that FF is a status named "NB-JD_INT_Status". This signal comes from the NB JD and is used also to produce an interrupt. This option is useful when operating at a single interrupt source. In the same way the WB JD produces the WB-JD_INT at the Set (S) input of a dedicated SR FF. The output of that FF is a status named "WB-JD_INT_Status". This signal comes from the WB JD and is used also to produce an interrupt. This option is useful when operating at a single interrupt source. Propagation of both status signals can be blocked individually using an AND gate. NB JD status ("JD1_INT_Status") is blocked by "Mask NB-JD" and WB JD status is blocked by "Mask-"WB-JD". The output of the two AND gates is the interrupt signal propagation. The NB JD signal is NB-JD_INT_Out and the WB_JD signal is WB-JD_INT_Out. In case two interrupts mode is enabled, "Two Interrupts" control bit equals "1", and "WB-JD_INT_Out" is routed to a second SR FF via an additional AND gate. The output of that AND gate in named "JD2_Interrupt" and it feeds the set input of the second dedicated SR-FF. The output of that dedicated FF is the interrupt status of the WB_JD named as "WB-JD_INT_Output_Status" That interrupt status passes an AND gate and becomes an interrupt signal named as "WB-JD_INT_Output" That interrupt is masked individually during a polling process done at release time by a masking control bit named "WB-JD_INT_EN". The NB JD signal named NB-JD_INT_Out is routed to an OR gate. In case of two interrupt mode, i.e. "Two Interrupts" control bit equals "1", the second input of the OR gate is "0". As a consequence, the output of the OR gate named "JD interrupt" that feeds the set input (S) of a dedicated SR FF represents the NB JD interrupt source. The output of that SR FF named "NB-JD_INT_Output_Status" serves as the NB_JD status bit and interrupt source for the NB_JD. The "NB-JD_INT_Output_Status" feeds an AND gate and produces the interrupt signal named "NB-JD_INT_Output" or "JD_Interrupt_Output". This interrupt signal can be masked individually by the "NB-JD_INT_EN" during a polling process and release time. The "NB-JD_INT_Output_Status" or "JD_INT_Output_Status" signal is used also as the NB JD status bit in a polling process during the release time. The four mask options adds debug options and further resolution for the interrupt source, however those options can be minimized by giving up the two output SR-FFs and two output AND gates to save logic and signals.

When operating at a single interrupt the usage of four SR-FFs saves status readings and provides a choice of what status to be read depending on application. In case a single read is requested, the status of the output SR-FF status named NB-JD_INT_Output_Status is read. If the source of interrupt is requested, NB-JD_INT_Status or WB-JD_INT-Status is read. Having only two SR-FFs, one for each JD, would require reading two JD status bits, one for the NB JD and the other for the WB JD during the polling process occurring at the release time either for a single interrupt configuration or two interrupts configuration.

As an example, to save resets, all SR-FFs are reset by a single control bit named "INT_CLEAR" to clear the interrupt and status bits. The "INT_CLEAR" signal applied on the reset input of the SR-FF has a priority over the set input of the SR-FF. INT_CLEAR is performed by a digital signal processor, general purpose processor or hardware that manages the AGC and JD on the digital baseband side.

Figure 11B:
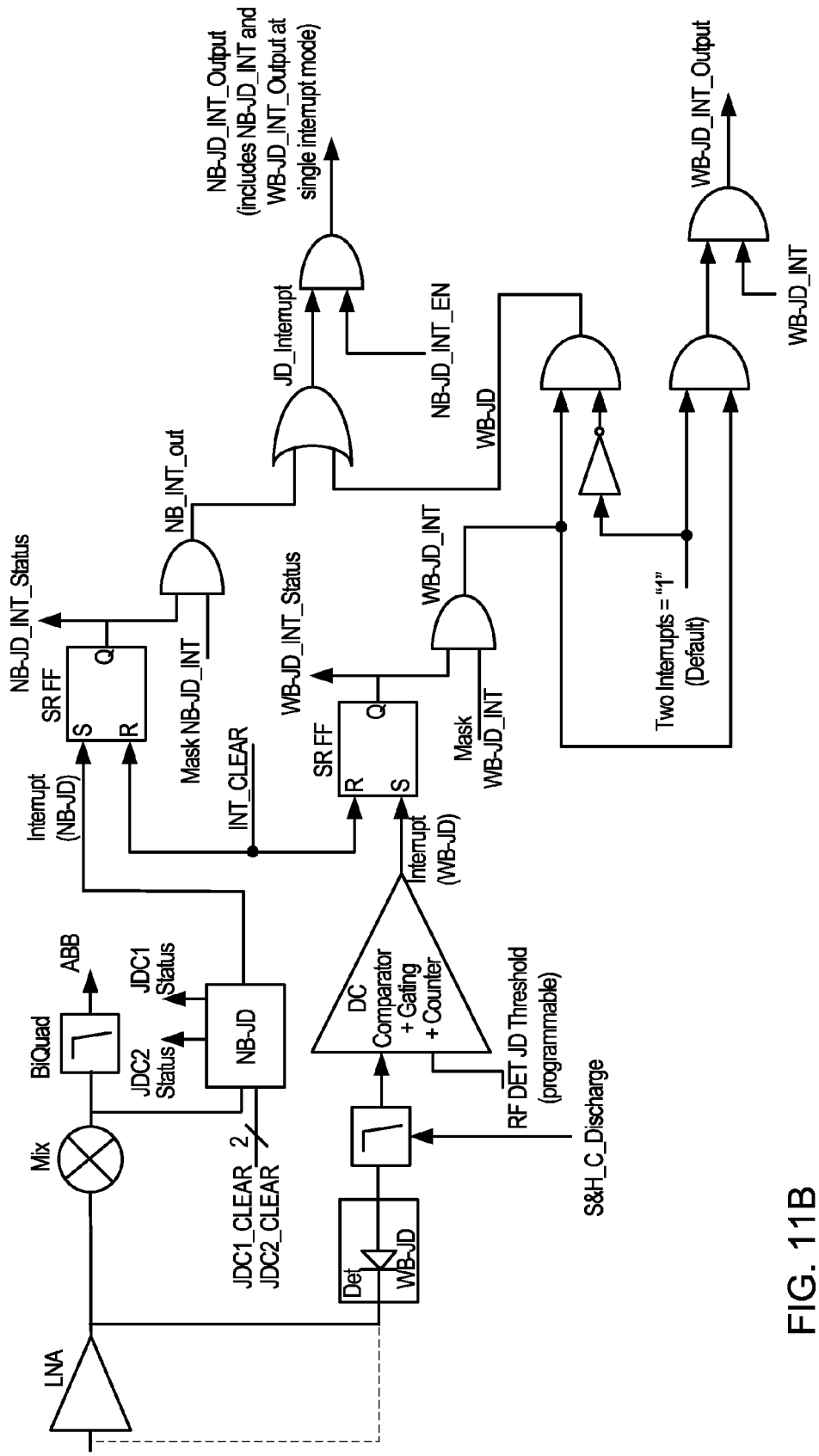
FIG. 11b illustrates another example interrupt and status report from the NB JD and WB JD.

In one aspect, an additional set reset flip flop (SR FF) is added to keep the status bit for an interrupt state from the WB JD. In a single interrupt, the two interrupt control bits are "0". After the interrupt is reset in the wakeup mode, the output of both the status (WB-JD_INT_Output_Status) and interrupt (WB-JD_INT_Output) report of JD2 is at "0" permanently as there is no use for the JD2 interrupt option. In one aspect, it can be programmed for two interrupts. In one aspect, the number of interrupts and statuses are extended to equal the number of jammer detector components (WB JD, NB JD, etc.) that are implemented to increase the resolution and identification of a jamming source. In one example, an interrupt assertion provides a status report to the status register dedicated bit to inform the source of an interrupt event, whether it is a close or a far jammer and the source of detection, either the NB JD or WB JD. The information provided is useful for diagnostics and debugging. FIG. 11b illustrates another example interrupt and status report from the NB JD (NB-JD_INT_Status) and WB JD (WB-JD_INT_Status) with a simpler jammer interrupt generation logic using only 2 set reset flip flops (SR FF).

SR FFs (set reset flip-flops) are used to keep the status bit for an interrupt state of WB JD and NB JD. In case of a single interrupt operation mode, WB-JD_INT_Output signal is blocked, but the interrupt source is detected by polling the status bit of the WB JD. The interrupt and status stay high until they are reset to "0" by a processor. Any interrupt assertion provides also a status report to the status register dedicated bit to inform the source of interrupt event, close or far jammer and source of detection NB JD or WB RF detector JD. This is useful for diagnostics and debugging. FIGS. 10a and 10b illustrate the sources for the JD status register. This figure does not depict the "Flip-Flop" (FF) but illustrates the reporting concept.

In one aspect, FIGS. 10a and 10b illustrate the interrupt sources and status reporting to the jammer detector register with implementations of the "flip flop" (FF) (not shown). An example list of interrupt sources and their respective descriptions as shown in FIGS. 10a, 10b, 11a, 11b are as follows:

1. JDC1_Close J: NB-JD far jammer counter report (status), FIG. 10a, 10b, provides additional NB-JD resolution if it detected adjacent channel i.e., N±1.
2. JDC2_Close J: NB-JD close in jammer counter report (status), FIGS. 10a, 10b, provides additional NB-JD resolution if it detected adjacent channel i.e., N±2 or above.
3. NB-JD_INT_Status: NB-JD interrupt report status stored in SSBI register for polling (FIGS. 10b and 11b)
4. WB-JD_INT_Status: WB-JD interrupt report status stored in SSBI register for polling (FIGS. 10b and 11b)
5. NB-JD_INT_Output: NB-JD interrupt report to BB via GPIO (FIGS. 10b and 11b)
6. WB-JD_INT_Output: WB-JD interrupt report to BB via GPIO (FIGS. 10b and 11b)
7. Interrupt(WB-JD): WB-JD detector block output (FIG. 11b)
8. Interrupt(NB-JD): NB-JD detector block output (FIG. 11b)
9. WB-JD_INT_EN: WB-JD interrupt masking (General Interrupt Mask to DSP, it is not blocking the status reports but prevents the interrupt to signal DSP and makes it "0" till it is unmasked) (FIGS. 10b and 11b)
10. NB-JD_INT_EN: NB interrupt masking (General Interrupt Mask to DSP, it is not blocking the status reports but prevents the interrupt to signal DSP and makes it "0" till it is unmasked) (FIGS. 10b and 11b)
11. Two_Interrupts: Control bit enables two interrupt GPIO activities, one for NB JD and the other for the WB RF JD if set to "1" if set to "0" both the NB-JD and WB-JD interrupts are going through the NB-JD interrupt port (NB-JD_INT_Output). (FIGS. 10b and 11b, 10a and 10b)
12. INT_CLEAR: Resets all interrupts and resets interrupts status bits has priority over set interrupt. (FIGS. 11a and 11b)
13. JDC1_CLEAR: Clears the NB close in status bit (FIGS. 11a and 11b)
14. JDC2_CLEAR: Clears the NB far status bit (FIGS. 11a and 11b)

There are two masks for the interrupt, one for NB JD and one for WB JD for the debugging option. When the processor masks the interrupt (NB-JD_INT_Output and WB-JD_INT_Output), the JD_Interrupt_Output_Mask is "0". The two lines of Mask_WB-JD_INT and Mask_NB-JD_INT are at "1" at all times and are used for debug purposes as an example as shown in FIGS. 10a, 11b.

In one aspect, the jammer detector is implemented with other implementations besides a hardware implementation. Listed below are examples of other feasible implementations for performing the functions of the jammer detector in accordance with the present disclosure.

Figure 12:
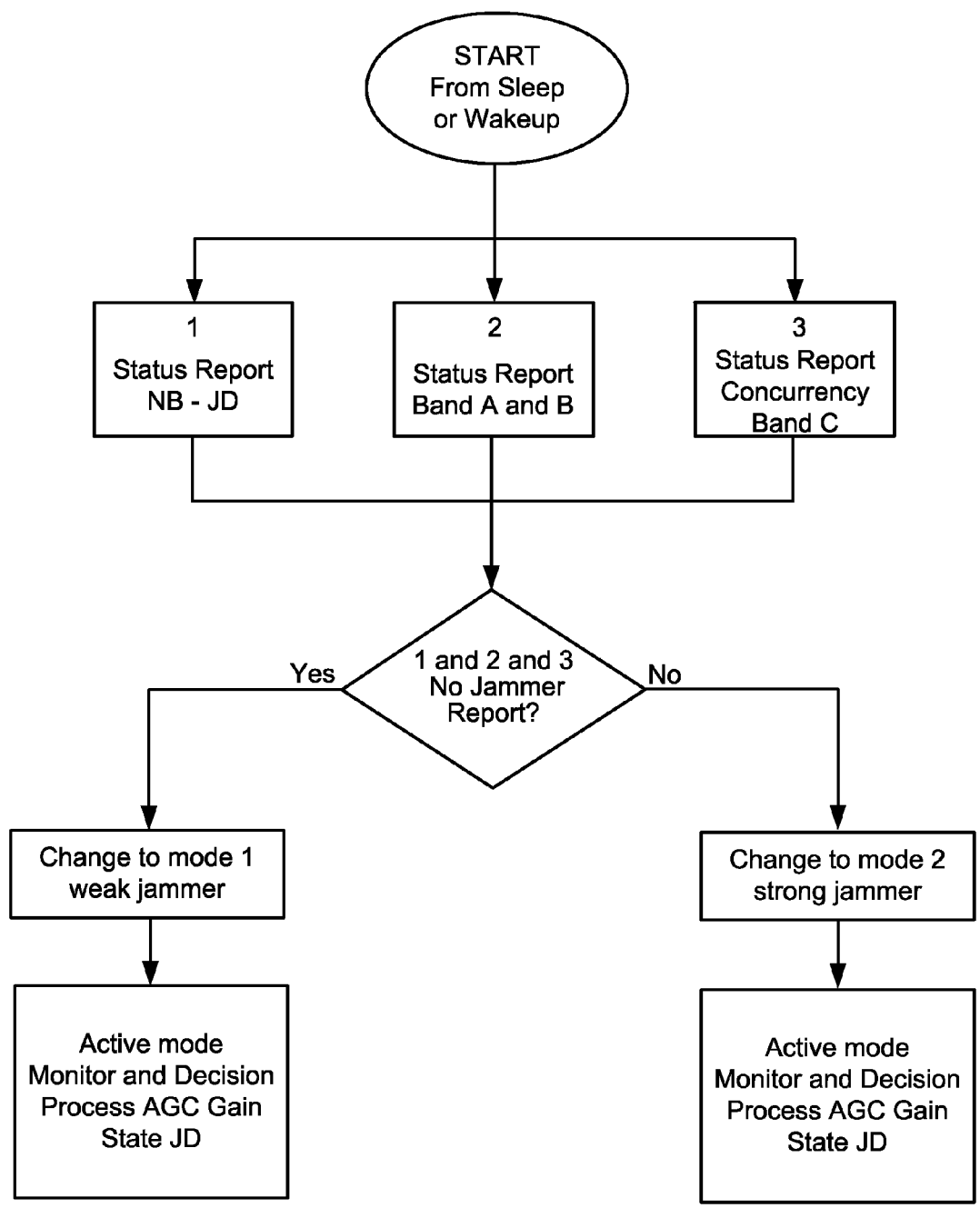
FIG. 12 illustrates an example of a combination hardware and software implementation for the jammer detection of in-band close-in jammers, far off jammers and jammers from concurrent operations.

1) hardware
   Jammer detection is based on dedicated hardware such as WB JD, NB JD or any other hardware jammer detector type.
2) modem
   Use a modem as a quality of service meter (e.g., bit error rate (BER), VBER, MFER). In one example, the modem is part of the receiver.
3) concurrency
   Use a priori information (e.g., power level) of the transmit event and create a SW JD reporting system to cover band C.
4) sweep mode
   Use the sleep time for channels to sweep and perform energy measurement
     Prior to wakeup, the receiver performs an RF sweep of all bands and measure the energy of each frequency channel
     Based on the measurement, the mode of the receiver is defined One skilled in the art would understand that the jammer detector is not limited to the examples or combinations of the examples listed below, and that other feasible implementations may be used without affecting the spirit and scope of the present disclosure. FIG. 12 illustrates an example of a combination hardware and software implementation for jammer detection of in-band close-in jammers, far off jammers and jammers from concurrent operations.

In the example in FIG. 12, a software implementation is combined with a WB JD hardware and a NB JD hardware. In one example, a wireless communication unit for detecting a jammer comprises transmitters and receivers for different applications. The wireless communication unit also comprises a narrowband jammer detector hardware for detecting in-band jammers, a wideband jammer detector hardware for detecting out of band and far off jammers, and a software-based jammer detector for detecting concurrent operation jammers from one or several transmitters that operate in band C in our example of frequency mapping. If a concurrent operation jammer is detected, a notification regarding the concurrent operation jammer is generated and sent to the receivers to notify the receivers of the concurrent operation jammer.

Figure 13A:
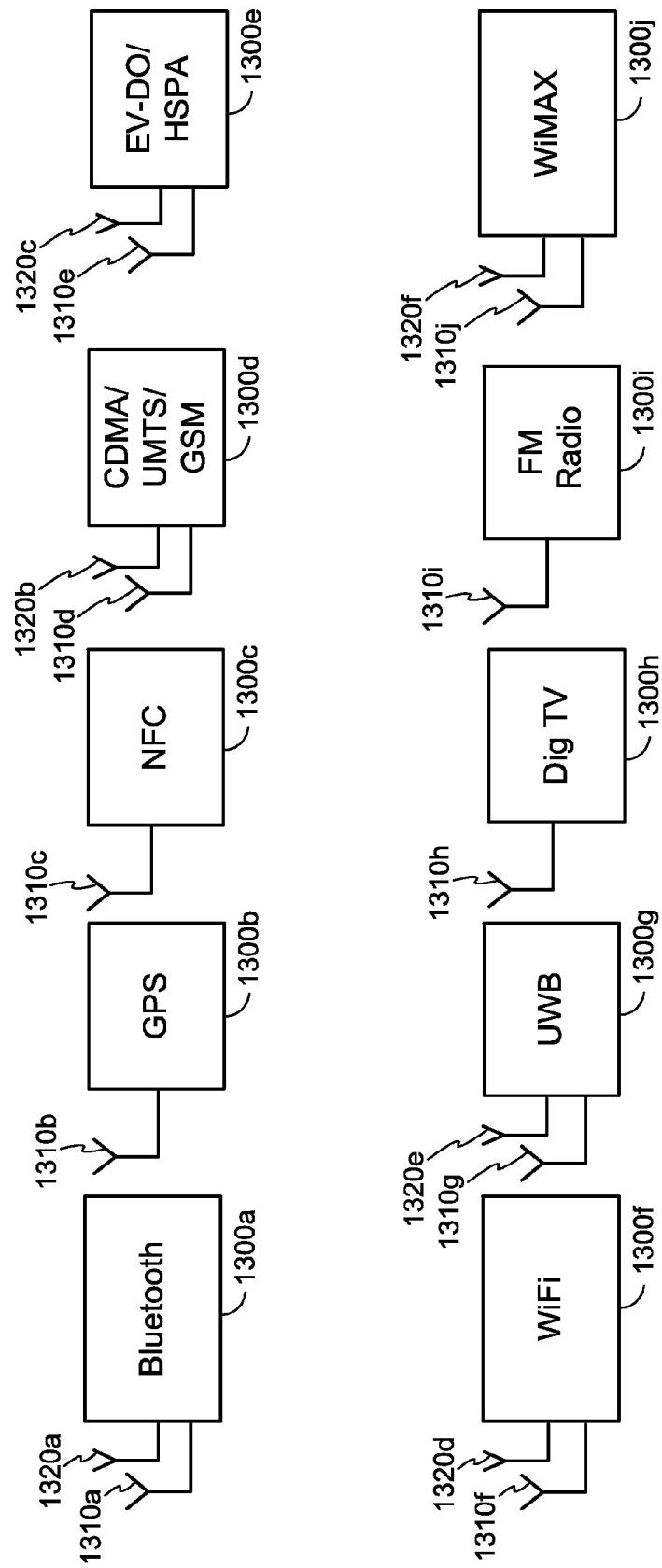
FIG. 13a illustrates an example of a multicom radio mobile telephone with several receivers, transceivers and connectivity technologies and with several integration levels such as high, medium and low attach rates.

In another aspect, the jammer detector is implemented in a multi-communication unit ("multicom unit"). In one aspect, a multicom unit includes a receive and transmit platform operable on a variety of applications. One example of a multicom unit is a multicom radio mobile telephone operable on a variety of applications. In another example, a multicom radio mobile telephone has several levels of integration to meet various applications. FIG. 13a illustrates an example of a multicom radio mobile telephone with several receivers, transceivers and connectivity technologies and several integration levels with high, medium and low attach rates.

In the example shown in FIG. 13a, the multicom radio mobile telephone includes multiple radio types and multiple dedicated antennas with the ability to operate them simultaneously and in coexistence. The radio types may be categorized as follows:
1. High attach rate
  Bluetooth
2. Medium attach rate
  Global Positioning System (GPS)
  FM radio
  WiFi (Wireless Fidelity)
  Mobile TV (Digital Video Broadcasting (DVB))
3. Low attach rate
  Wireless USB (Ultra Wideband (UWB))
  NFC (Near Field Communication; radio frequency identification (RFID) technology)

In one aspect, the multicom radio mobile telephone depicted in FIG. 13a is implemented using any one of the three example integration architectures: a) vertical integration with no reuse and sharing of resources (antenna-RF-modem-protocol) used in current implementations; b) parallel coexistence used in traditional designs with, for example, desensitization protection without sharing resources; and c) common resources with reuse (i.e., vertical and horizontal integration as suggested in this invention). Typically, the functionality activities integrated within the multicom radio mobile telephone are not shared. Alternatively, a common resource is created for transferring all transmit activities to the jammer detector which, in one example, is a combined software and hardware implementation as shown in FIG. 1a.

One implementation of FIG. 13a is a wireless communication unit for jammer detection comprising a plurality of receivers for at least one of a plurality of applications; a plurality of transmitters for at least one of the plurality of applications; a wideband jammer detector for generating a wideband (WB) interrupt signal to indicate the presence of a wideband jammer; a narrowband jammer detector for generating a narrowband (NB) interrupt signal to indicate the presence of a narrowband jammer; an interrupt logic module for generating a composite interrupt signal based on at least one of the WB interrupt signal and the NB interrupt signal; a software-based jammer detector for detecting a concurrent operation jammer from one of the plurality of transmitters; and a central software based mechanism for sending a notification of the concurrent operation jammer to at least one of the plurality of receivers. One skilled in the art would understand that in one aspect, the central software based mechanism is a processor within the wireless communication unit. For example, the central software based mechanism may be part of the SW JD bulletin board 1330 in one implementation.

Figure 13B:
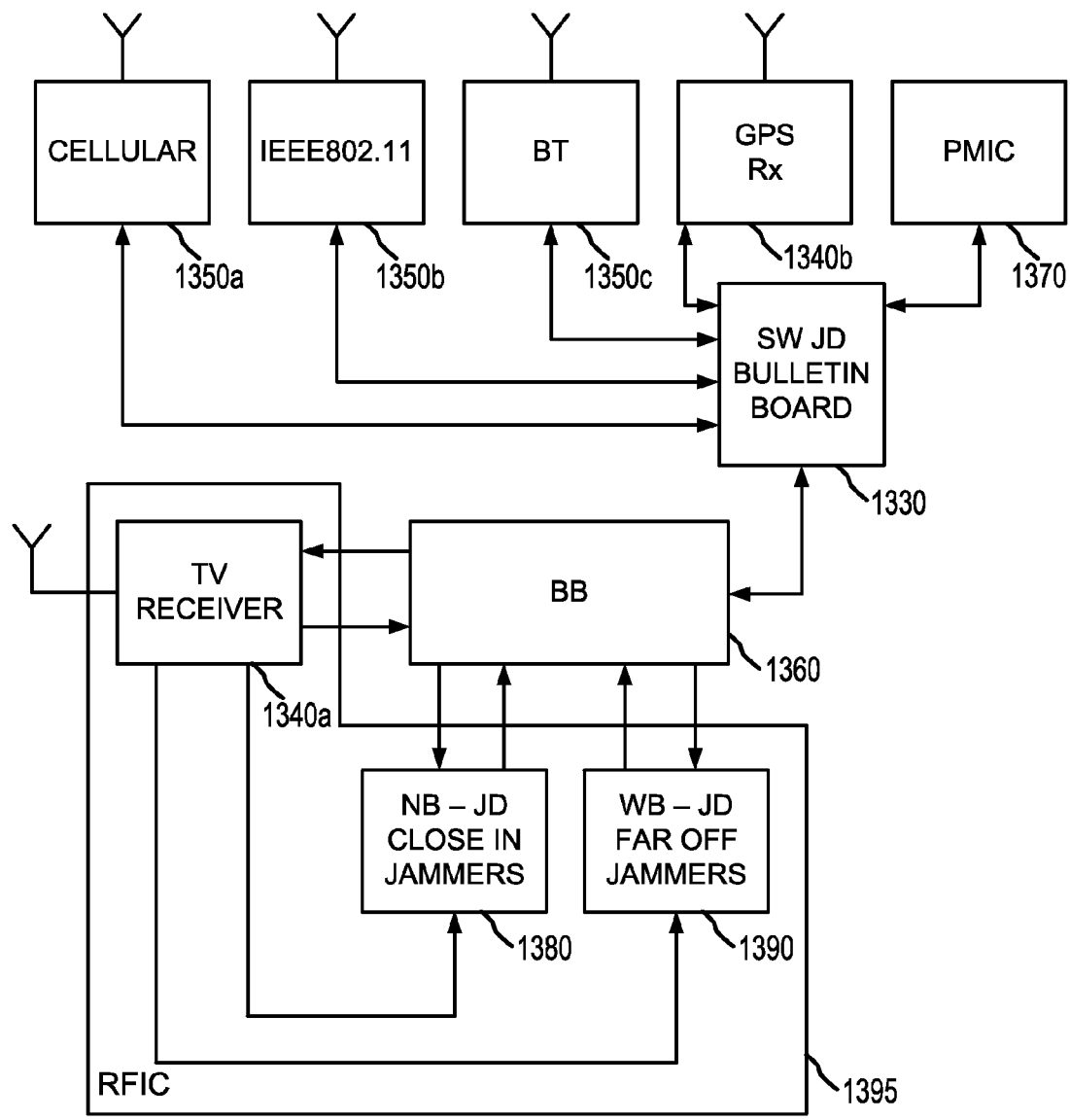
FIG. 13b illustrates a hardware JD example, including a combination of a NB JD and a WB JD along with a software JD to cover concurrent operation with the ability to sniff the power supply and wherein the PMIC monitors concurrent operation indirectly or monitors concurrent operation current consumption and provides overall platform current logs.

FIG. 13b illustrates a hardware JD, including a combination of a NB JD 1380 and WB JD 1390 along with a software JD 1330 to cover concurrent operation. The software JD posts and reports on a bulletin board 1360 a priori concurrent transmit information from cellular sources 1350a (e.g. GSM, WCDMA, LTE, etc.), WiFi 1350b (IEEE802.11), and Bluetooth 1350c, for example. In addition, FIG. 13b illustrates a GPS Rx 1340b and a TV receiver 1340a as examples for receiving GPS or TV signals. As shown in FIG. 13b, the TV Receiver 1340a, the NB JD 1380 and the WB JD 1390 are implemented on a radio frequency integrated circuit (RFIC) 1395. The receiver is protected by transferring it into high linearity mode. The hardware JDs provide fast real-time jammer detection of far off jammers (both concurrent and off air) by the WB JD and close in jammers by the NB JD. They generate interrupts which protect the receiver by transferring it into high linearity mode with a fast attack algorithm. After all jammers vanish and all reports indicate no jammers present, the receiver is transferred back into high sensitivity mode with a slow release algorithm.

In one aspect, the software-based jammer detector 230, 1330 includes a coexistence management unit for monitoring power consumption of a multicom unit wherein the coexistence management unit can optionally provide a power consumption current log. In one aspect, the coexistence management unit manages the operations of a receiver by notifying of expected transmissions or by organizing a silence for the receiver. Also, in one example, the coexistence management unit maps at least one of a spectrum, a RF level or a transmit level based on GPS location. In one example, the software-based jammer detector is a component within the receiver.

In one aspect, the software-based jammer detector selects different mixer types. For example, the different mixer types comprise a single-ended resistive mixer (SRM) and a harmonic reject mixer (HRM). In one example, the different mixer types are within the LNA-Mixer 750 (shown in FIG. 7b).

In one aspect, the jammer detector is used for power consumption optimization. For example, the following steps illustrate the optimizing of the LNA operating point and biasing based on the jammer detector state:
1. When a jammer is detected, the LNA bias point can be enhanced to improve third order intercept point (IP3) performance and 1 dB compression point (P1dB) at the expense of noise figure (NF).
2. If there is a weak jammer, the LNA bias point is optimized for low NF at the expense of IP3 and P1dB performances.
3. If there is no jammer the LNA bias point is optimized for lower current, higher gain and lower NF.
4. If there is a strong jammer the LNA bias point is optimized for higher IP3 and P1dB performances or LNA switches to G1.

One skilled in the art would understand that the steps for optimizing LNA operating point and biasing described herewith are not exclusive and that other steps or combinations thereof may be used without affecting the spirit and scope of the present disclosure.

In another example, the following steps illustrate the optimization of the analog baseband (ABB) section filtering:
1. When the jammer detector reports no jammer or a weak jammer, the receiver relaxes the ABB LPF rejection by reducing its number of filter sections (e.g., using bypassing circuitry) and therefore reducing its insertion loss. As a consequence, gain stages are optimized to lower gain and current consumption while still maintaining the overall C/N performance.
2. When a strong jammer is detected, the receiver optimizes the ABB LPF with higher rejection to reject undesired signals.

One skilled in the art would understand that the steps for optimizing the analog baseband (ABB) section filtering described herewith are not exclusive and that other steps or combinations thereof may be used without affecting the spirit and scope of the present disclosure.

In another example, the receiver switches between a regular mixer (SRM) and a harmonic mixer (HRM) based on the jammer detector indication and the type of jammer so as to optimize the mixer type.

Figure 13C:
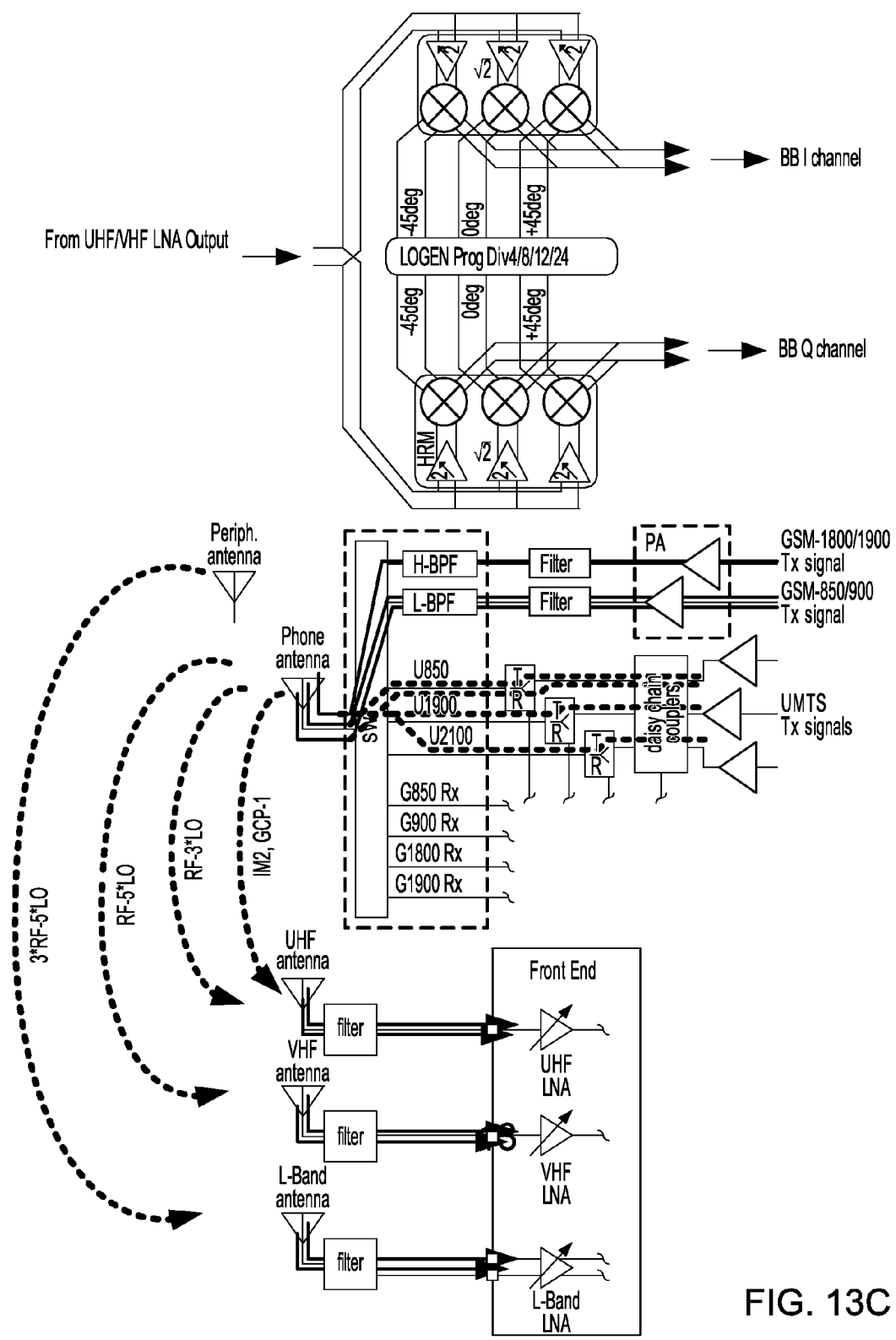
FIG. 13c illustrates an example of an interference scenario where concurrent radio systems are operating, and the transmitter from one system couples spurious signals into the receiver of another system.

FIG. 13c illustrates an example of an interference scenario where concurrent radio systems are operating, and the transmitter from one system couples spurious signals into the receiver of another system. In one example, the SW JD determines ahead of time that the radio operations of the two systems will be concurrent and proactively protects the receiver hardware path. In one aspect, the LNA path is selected as Mode 2 to provide improved linearity. In another aspect, the receiver mixer is switched from a single-ended resistive mixer (SRM) to harmonic reject mixer (HRM) to improve the protection against specific spurious products. For example, the receiver protects against spurious products resulting from the mixing of the third order harmonic of the RF signal with the fifth order harmonic of the local oscillator (LO) signal (i.e. 3RF-5LO product) and from the mixing of the second order harmonic of the RF signal with the third order harmonic of the LO signal (i.e. 2RF-3LO product). This step generally improves the receiver third order intercept point (IP3) and second order intercept point (IP2) to provide better linearity.

In another example, the following steps illustrate the optimization of the mixer bias point:
1. When the jammer detector reports no jammer or a weak jammer, the receiver relaxes the mixer current and consumes less battery power.
2. When a strong jammer is detected, the receiver optimizes the mixer current to compensate for the dc leakage due to the second order intercept point (IP2) and to improve the third order intercept point (IP3) and gain compression point.
3. When JD reports no jammer, LO power is adjusted to SRM mixer.
4. When JD reports on jammer LO power is adjusted to HRM mixer.

One skilled in the art would understand that the steps for optimizing the mixer bias point described herewith are not exclusive and that other steps or combinations thereof may be used without affecting the spirit and scope of the present disclosure.

Figure 14A:
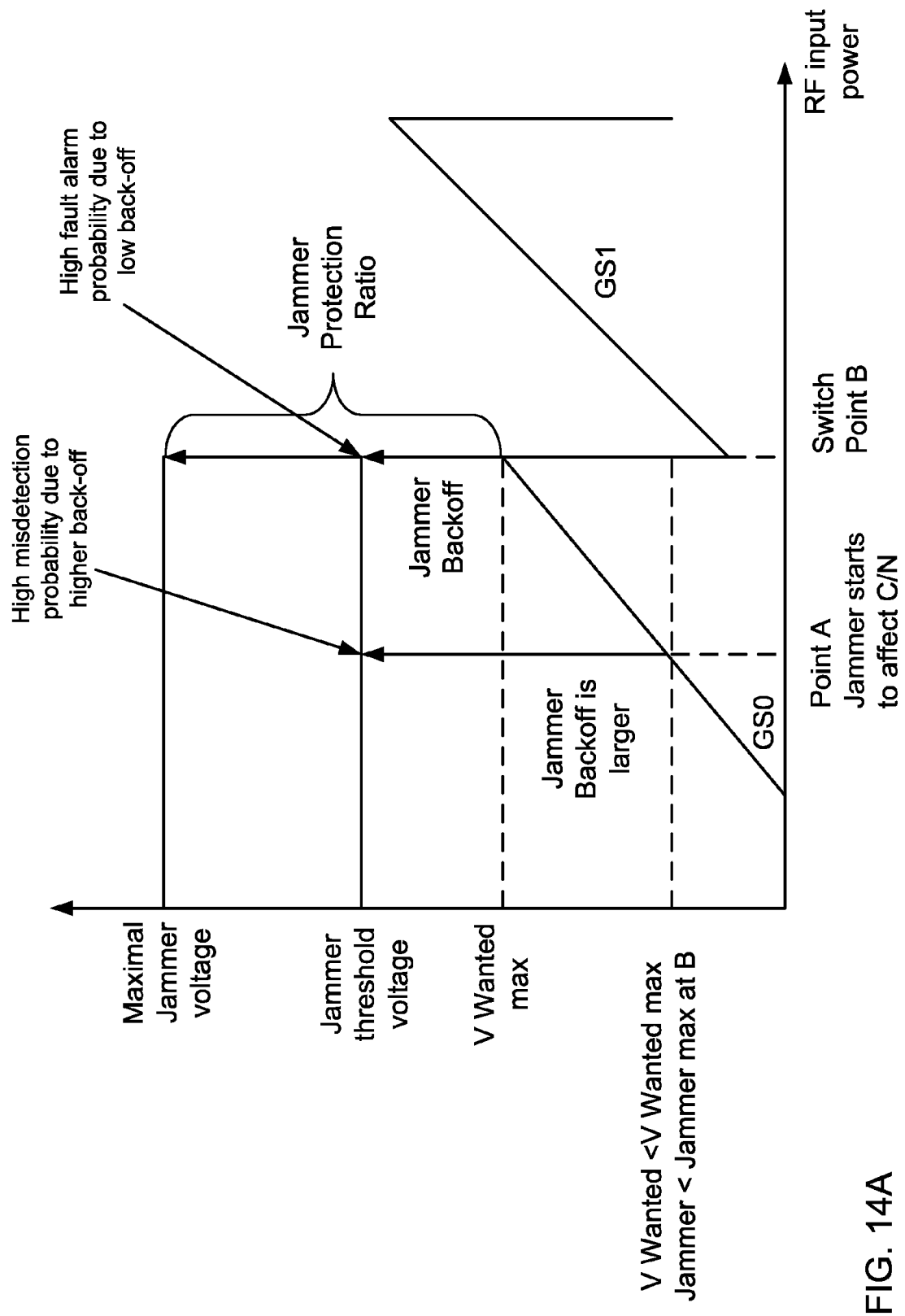
FIGS. 14a and 14b illustrate two examples of RF power versus jammer voltage relationships that can be used for adaptive TH.
Figure 14B:
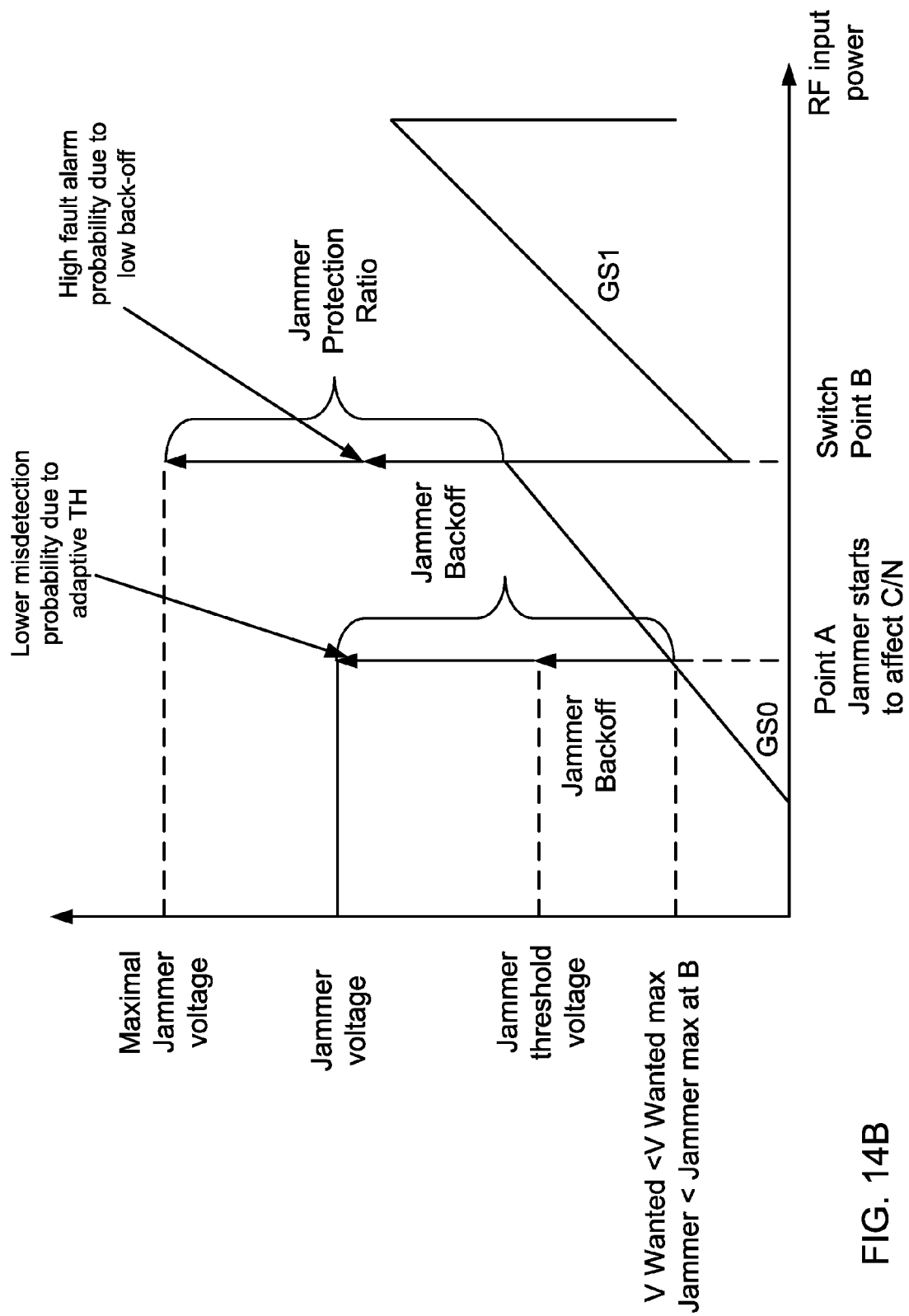

FIGS. 14a and 14b illustrate two examples of RF power versus jammer voltage relationship. Shown in FIGS. 14a and 14b are gain states G0 and G1 wherein the gain state transition from G0 to G1 is indicated by switch point B. FIG. 14a illustrates an example of RF power versus jammer voltage relationship for a fixed threshold. FIG. 14b illustrates the example of RF power versus jammer voltage relationship for an adaptive threshold. The jammer detector protects the receiver throughout its gain states. In one aspect, an adaptive threshold provides further protection against jammers. Using a fixed setting of jammer thresholds at the switch points does not protect the entire gain state. At the switch point, the desired signal and jammer level may reach the maximum level. When selecting a threshold at the switch point for jammer detection for the entire gain state, the jammer detection threshold at low power is too high and will increase misdetection probability as illustrated by FIG. 14a. Furthermore, misdetection results in C/N degradation due to increases in intermodulation level, cross-modulation level and gain compression. To minimize misdetection, in one example, divide the gain state into subsets of the G0 gain state where each subset has a different jammer detection threshold.

Accordingly, the jammer detector with the divided gain state/adaptive thresholds protects the receiver over the entire power range defined for that gain state, decreases the misdetection probability and maximizes the dwell in the G0 gain state. The divided gain state with the adaptive thresholds increases the receiver sensitivity without causing susceptibility to jammer distortion and C/N degradation. Usage of adaptive thresholds relaxes the G0 gain state requirements since the reference level for detection in point A in FIG. 14b is lowered and does not allow the jammer to signal ratio to be higher than point B in FIG. 14b. Adaptive thresholds are applicable to other gain states, such as the G1 gain state.

In one aspect the wideband threshold is adaptive based on wanted power. In another aspect, the narrowband threshold is adaptive based on wanted power. In one example the wideband threshold or the narrowband threshold is loaded by an automatic threshold setting logic (not shown), wherein the automatic threshold setting logic is optionally based on the gain state of a radio frequency integrated circuit (RFIC).

In another aspect, the WB JD and NB JD components are implemented using existing hardware designs. In one example, the NB JD decision logic is used as a digital low pass filter to create easily programmable conditions for identifying jammers, for example, for N±1 to N±4. The decision logic of the NB JD is used for both wideband and narrowband jammer detection. The NB JD decision logic estimates jammers by integrating within a predefined gate of a number of crystal oscillator cycles. This process defines the pass/fail threshold. In one example, the pass/fail threshold is digital and programmable.

Figure 15:
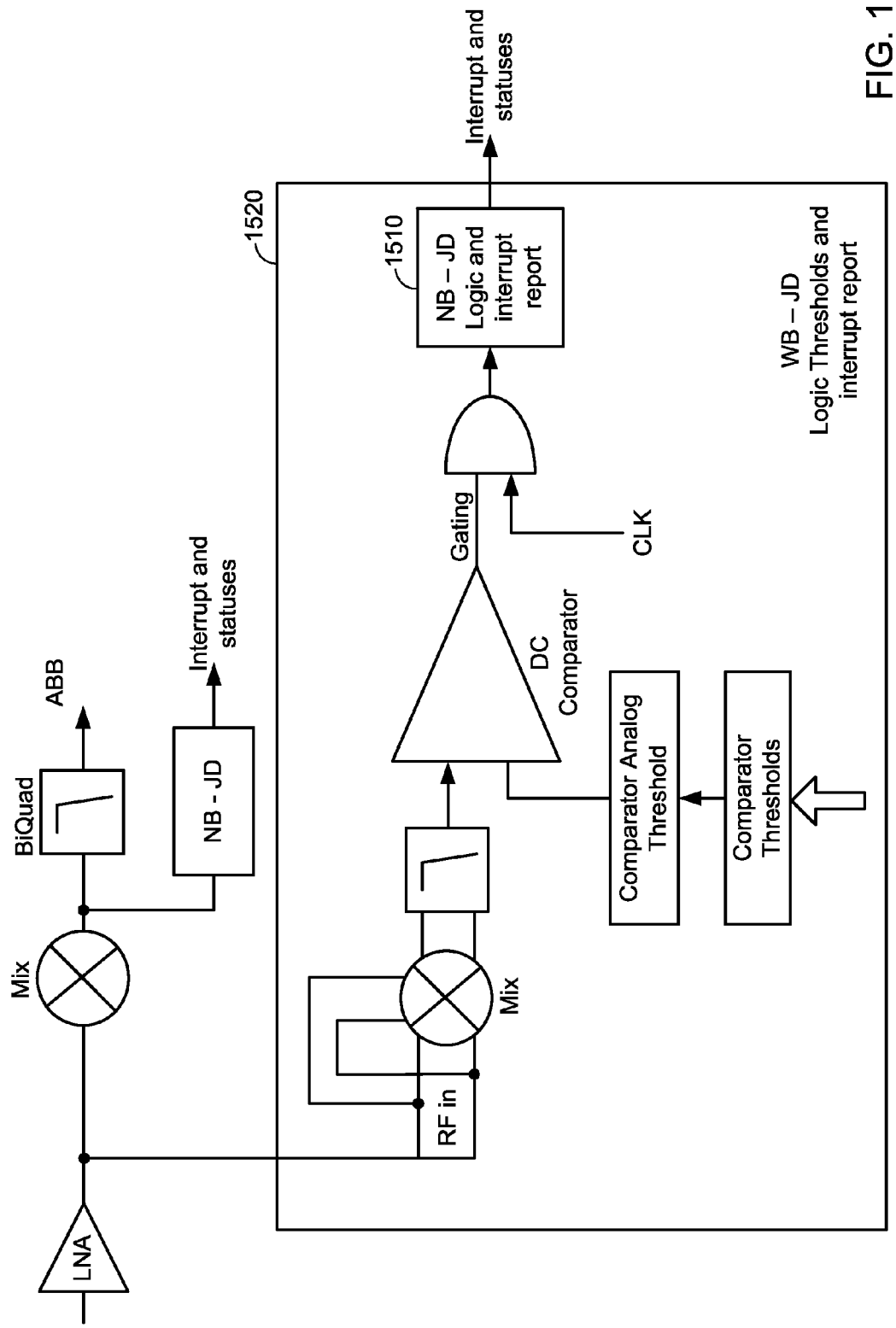
FIG. 15 illustrates an example for modifying the NB JD logic to support the WB JD exclusively.
Figure 16:
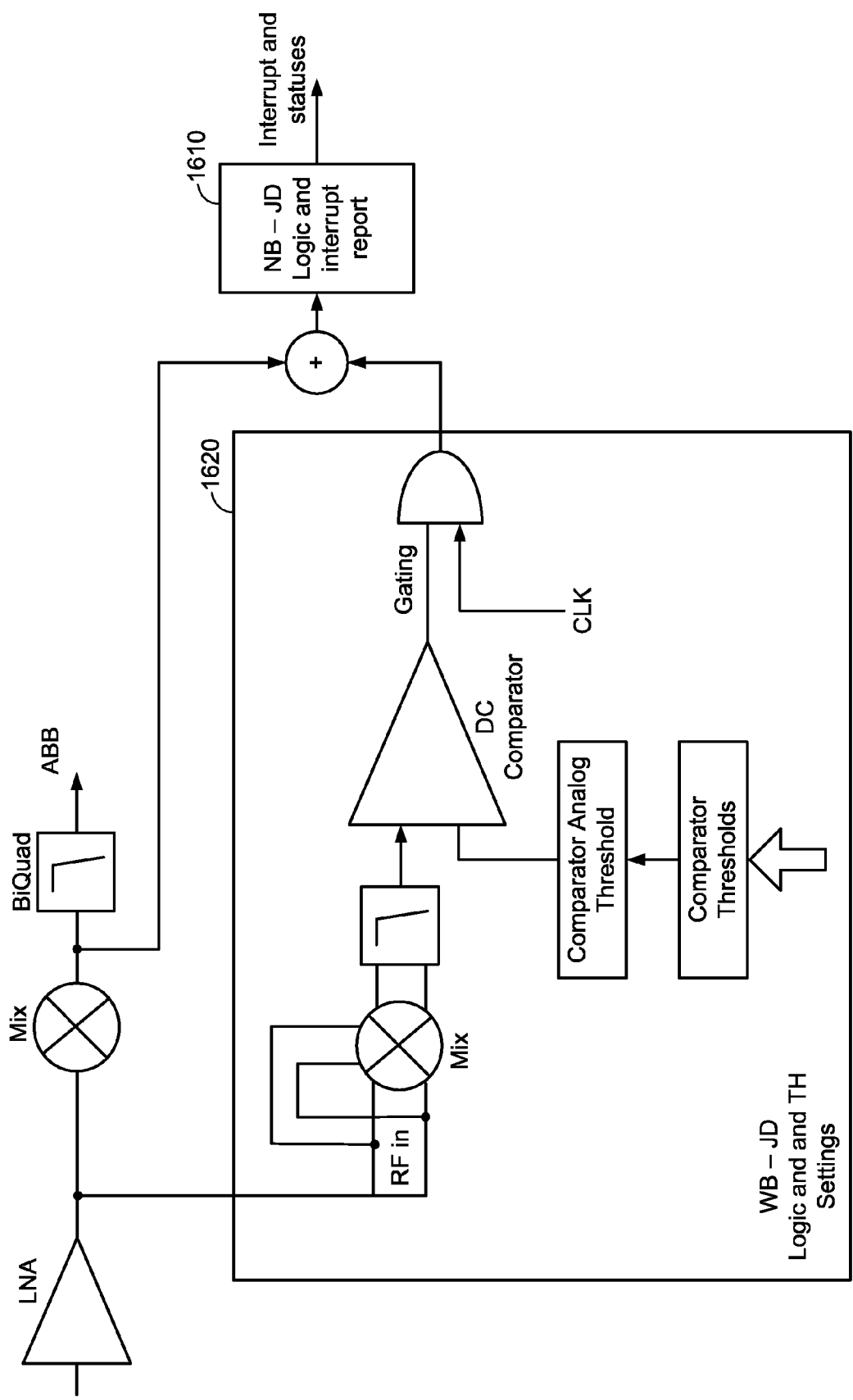
FIG. 16 illustrates an example for modifying the NB JD logic to support the WB JD and the NB JD for using the same logic and for saving HW.

In one aspect, the WD JD is based on a RF detection (self mixing, RF detector, etc.) of received energy. The WD JD reports a voltage proportional to the wideband jammer duration. For example, integration of the WB JD with the NB JD is based on the following considerations:
1. creating a time gating signal proportional to bands C and B jammer intensity;
2. enabling the counter clock based on the time gating signal duration with an AND gate that is applied on the counter clock as illustrated by FIGS. 15 and 16.
3. defining a digital integration threshold as in the NB JD. Reaching the integration threshold will depend on the duration of the time gate being equal to "1" which is proportional to the jammer energy and duration. Reaching the digital integration threshold will produce an interrupt.

The power saving process can be implemented on several receivers which are sharing the same source of JD information about a concurrent transmit activity or transmitting termination. That approach of concurrent activity JD information sharing is one aspect of horizontal integration approach suggested in our invention.

FIG. 15 illustrates an example for modifying the NB JD logic to support the WB JD. As shown in FIG. 15, the NB JD includes two logical circuits for jammer detection. The first logical circuit in the NB JD is used for narrowband jammer detection. The second logical circuit in the NB JD is used for wideband jammer detection. Similarly, FIG. 16 illustrates an example for modifying the NB JD logic to support the WB JD and the NB JD.

In one example, the receiver includes a functionality to ignore the jammer detector interrupt and to mask the jammer detector interrupt automatically based on a predetermined gain state. The receiver logic block will identify the predetermined gain state and will implement an automatic mask for that predetermined gain state and any gain state above it. An actual gain state of the receiver is obtained by reading the gain state command from the AGC circuit, logic or algorithm that is sent to the receiver logic block. In one aspect, there are two ways to ignore the jammer detector interrupt: 1) automatically mask the jammer detector interrupt bit for gain states that are predetermined to be masked and 2) reset the jammer detector interrupt bit and maintain it at a value of zero. In one aspect, the gain states that are predetermined to be masked are programmable. The automatic masking can be activated or deactivated, for example, by a command from the receiver RF section, by a command from a processing unit associated with the receiver or by a command sent through a single-wire serial bus interface (SSBI) or any other interface. In another aspect, the mask to the jammer detector interrupt is removed by a processing unit associated with the receiver in either the automatic masking or regular operation. Additionally, the interrupt masking can be further expanded to turn off the jammer detector hardware and save energy while the receiver is in gain states that are not relevant for jammer detection operation. In one aspect, reactivation of the jammer detector is automatic if the gain state is one level higher than the predetermined gain state. JD refers to either in mode 1 or mode 2.

In one aspect, the receiver incorporates the functionality for loading jammer detection thresholds based on the assertion interrupt and gain states. The gain states are obtained by reading the gain state command from the AGC circuit sent to the receiver logic block. If the gain state directs the receiver to change to a gain state in which the jammer detector is valid and the interrupt is set to "1", the receiver logic block will automatically set the jammer detection thresholds based on the gain state and interrupt state being equal to "1", i.e. jammer was detected. If the gain state is outside the jammer detection activity and therefore is ignored, the receiver logic block will not perform automatic updating. Where there is an automatic mask of the jammer detector interrupt, the receiver logic block will block the jammer detector interrupt. In one example, the thresholds loadings are part of a polling process and a slow release algorithm. As an example, when receiver is at mode-2 (high-linearity moderate sensitivity), its JD has a threshold for mode 2 where the threshold is determined based on gain state. A threshold for mode 1 (high sensitivity low NF) is loaded by a management entity, such as a processor, only if at the end of the polling process of JD interrupt status bit (which lasts during the release time) all JD status bits that were read showed "0". The JD threshold levels are loaded based upon gain state when going from mode 2 to mode 1.

In one aspect, a multicom unit includes a variety of transceivers and companion receivers to provide a variety of simultaneous applications, services and connectivity abilities. In concurrent operation, the sensitivity of a receiver that is used for one application may be affected by the simultaneous transmission from a transmitter used for another application, due to the small size and high level of integration and finite isolation as illustrated in Table 3. The receiver and interfering transmitter combinations are elaborated in Table 4 as an example.

TABLE 3

Interferer

| Victim | WiMax | Wi-Fi | GSM 800 | CDMA 1800 | BT | UWB |
|---|---|---|---|---|---|---|
| WiMax | | | | | | |
| Wi-Fi | | | | | | |
| GSM 800 | | | | | | |
| CDMA 1800 | | | | | | |
| BT | | | | | | |
| UWB | | | | | | |
| GPS | | | | | | |

Isololation Requirements

Severe >55 dB  Moderate 40-55 dB  Cautious 25-40 dB  No-problem <25 dB

TABLE 4

| | | Req | | | | |
|---|---|---|---|---|---|---|
| Spec. | Sensitivity | Immunity to one adjacent signal | Immunity to two adjacent signals | Concurrent operation with transmitters | Concurrent operation with receivers | Design issues |
| NF | + | − | − | − | − | LNA, JD FE network |
| IP2 | − | +IM2 | − | +IM2, 2xRF spur response | − | LNA, MIXER, FE network, |

TABLE 4-continued

| Spec. | Sensitivity | Req Immunity to one adjacent signal | Immunity to two adjacent signals | Concurrent operation with transmitters | Concurrent operation with receivers | Design issues |
|---|---|---|---|---|---|---|
| IP3 | – | +XMOD | +IM3 | +XMOD, 3xRF spur response | – | JD |
| P1dB | – | + | + | + | – | LNA, MIXER, FE network,, BB filter, JD |
| Spur. response | – | – | – | mxFLO-nxFRF | – | |
| Synth. LO PN | +IPN | +RPN | – | – | By LO leakage | RF Synt. design, |
| Synth. LO Spurs | +ISN | +RSN | +RSN | – | By LO leakage | JD, TCXO spec, DC spec., |
| LO leakage | – | – | – | – | + | LNA, MIXER, FE network |
| ADC CLK PN | +(Jitter) | +RSN | +RSN | | + | Dig PLL. Design, BB filter TCXO spec., DC spec. |
| ADC CLK Spurs | +(Jitter) | +RSN | +RSN | | + | |

The radio types within the multicom unit operate over a wide bandwidth as an example from 168 MHz up to 2.7 GHz or, in another example, up to 5 GHz. In this particular case, a hardware based JD solution to enable concurrent operation is not practical. To mitigate the input power range over which the interfering signal is received, a very wideband and high dynamic range detector of approximately 70 dB is required. Table 5 summarizes an example of universal broadcast modem (UBM) digital TV receiver requirements for enabling concurrent operation with other co-resident radio types. Table 5 represents typical interference effects on performance which are applicable to any type of radio receiver.

TABLE 5

| JD No | Type | JD BW | Jammer Dominant Jammer | Threshold (TH) Criteria | TH (Nom) |
|---|---|---|---|---|---|
| 1. | NB JD | Up to 80 MHz | a. Adj. Jammer b. Phone Tx with Adj. Jammer | a. P1dB b. Xmod | TH1: −60 dBm nom. |
| 2. | WB JD | Up to 1 GHz | Far off in-band Jammers | IMR3 | TH2: −50 dBm nom. |
| 3. | SW Based | No limit (SW): Practically: 2.7 GHz | Phone MultiCom systems | Spurious: RF-N*LO | TH3: −80 dBm nom. |

The UBM receiver is susceptible to the following interference types due to concurrent operation with other transmitters:

1. Gain compression due to various transmission signals leaking into the UBM receiver at relatively high power.
2. Second order intermodulation products that are generated by the leakage of strong signals into the UBM receiver and which interfere with the desired signal. One example is the GSM 900 MHz transmitter that can leak into the UBM UHF wideband receiver and degrade performance due to second order intermodulation products.
3. Cross-modulation products generated by the leakage of strong interfering signals at the input of the UBM receiver that modulate other inband jammers, such as adjacent jammers, and expand its bandwidth into the bandwidth of the desired signal.
4. Leakage of strong transmission signals may also be mixed with the UBM receiver's local oscillator (LO) and generate spurious baseband products and thereby interfere with the desired signal.

Table 4 illustrates that the high linearity performance enables the receiver to mitigate the effects of strong interfering signals while other transmitters are being used. One way to mitigate strong interference, for example, is by notifying the relevant receivers that a specific concurrent transmitter at a specific frequency is activated and that its power level exceeds a predefined threshold. The notification can be utilized by the receiver to enhance linearity, or to change its operation mode (for example, from a high sensitivity mode to a high linearity mode) and thus protect the receiver sensitivity in the presence of concurrent jammers. If no notification is provided to the receiver, i.e. there is no concurrent transmission or the transmission is below a predetermined threshold, other receiver parameters such as sensitivity and power consumption can be optimized. The notification approach allows optimization of key receiver parameters according to the jammer environment and therefore provides improvement on overall performance as elaborated by Table 4. In one example, the notification is generated by a central software based mechanism that coordinates the operation of all the transceivers. In another example, all receivers can be notified of concurrent operation and can undertake protective actions to avoid desensitization as elaborated by Table 6. The same protective mode is activated by both the narrowband and wideband jammer detectors.

TABLE 6

| Mode | Gain | NF | Sensitivity | ADC TOG | P1dB Compression point | IP3 | Current Consumption |
|---|---|---|---|---|---|---|---|
| Traditional Design | ↓ | ↑ | ↓ | ↓ | ↑ | ↑ | ↑ |
| Mode 1 ChOrd notification is below threshold | ↑ | ↓ (by ~1.5 dB) | ↑ (by ~1.5 dB) | ↑ | ↓ | ↓ | ↓ |
| Mode 2 ChOrd notification is above threshold | ↓ | ↓ | ↓ | ↓ | ↑ | ↑ | ↑ |

Figure 17:
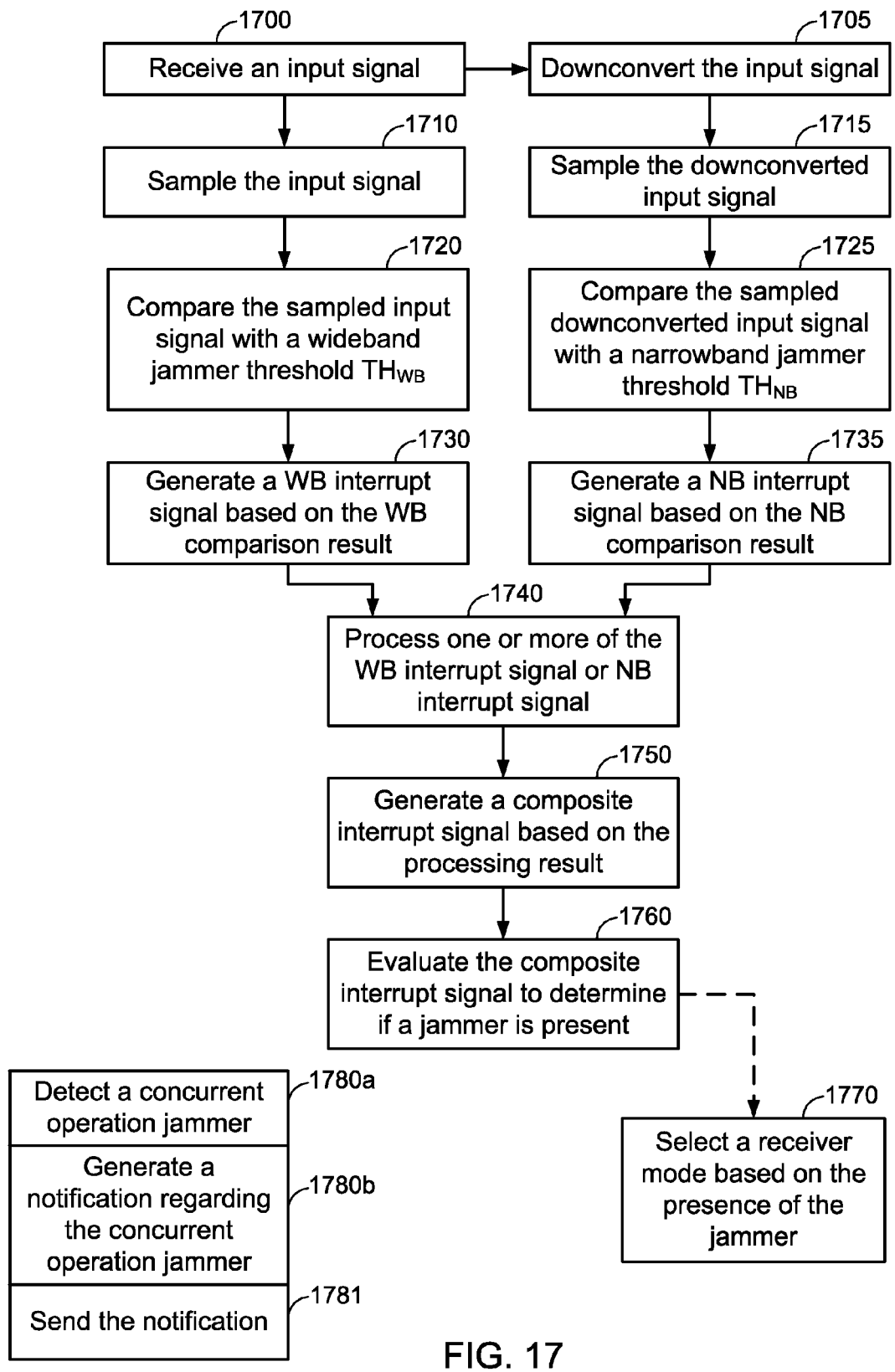
FIG. 17 illustrates an example flow diagram for detecting a jammer.

FIG. 17 illustrates an example flow diagram for detecting jammers. In block 1700, receive an input signal. In one example, the input signal is an RF signal. In block 1710, following block 1700, sample the input signal to generate a sampled input signal. Compare the sampled input signal with a wideband jammer threshold $TH_{WB}$ in block 1720. One skilled in the art would recognize that the values of $TH_{WB}$ can be based on various factors, such as but not limited to, system application, design constraints and/or user choice without affecting the spirit and scope of the present disclosure. In one example, the values of $TH_{WB}$ are stored in a memory. Proceed to block 1730. In block 1730, generate a wideband interrupt signal (a.k.a. WB interrupt signal) based on the wideband (WB) comparison results from block 1720. In one example, the WB interrupt signal is a bit. Following block 1730, proceed to block 1740.

In a parallel path, from block 1700, proceed to block 1705. In block 1705, downconvert the input signal to generate a downconverted input signal. Following block 1705, proceed to block 1715. In block 1715, sample the downconverted input signal to generate a sampled downconverted (SD) input signal. In block 1725, compare the SD input signal with a narrowband jammer threshold $TH_{NB}$ and proceed to block 1735. One skilled in the art would recognize that the value of $TH_{NB}$ can be based on various factors, such as but not limited to, system application, design constraints and/or user choice without affecting the spirit and scope of the present disclosure. In one example, the values of $TH_{NB}$ are stored in a memory. In block 1735, generate a narrowband interrupt signal (a.k.a. NB interrupt signal) based on the narrowband (NB) comparison results from block 1725. In one example, the NB interrupt signal is a bit. In one example, narrowband is defined as within the bandwidth of a receiver receiving the input signal. Following block 1735, proceed to block 1740.

In block 1740, process one or more of the WB JD interrupt signal or NB JD interrupt signal to generate a processing result and proceed to block 1750. In one example, the processing result is an indicator of whether one or more of the WB JD interrupt signal or NB JD interrupt signal include a bit to indicate the presence of a jammer. In one example, the processing result is a bit. In block 1750, generate a composite interrupt signal based on the processing result and proceed to block 1760. In one example, the composite interrupt signal is an indicator of whether or not a jammer has been detected. In one example, the composite interrupt signal is a bit. In one example, an interrupt logic module (e.g., a logic circuit) within the jammer detector generates the composite interrupt signal based on the processing result. In block 1760, evaluate the composite interrupt signal to determine if a jammer is present. In one aspect, the evaluating step evaluates the bit value of the composite interrupt signal to determine if a jammer is present. In one example, the AGC circuit performs the evaluating step. In one aspect, following block 1760, in block 1770, a receiver mode is selected based on the presence of the jammer.

In one aspect, the flow diagram of FIG. 17 is utilized with a software-based jammer detector (1780) for detecting a concurrent operation jammer from a plurality of transmitters (block 1780a), and for generating a notification regarding the concurrent operation jammer (block 1780b). A central software based mechanism sends the notification to one or more receivers to notify the receivers of the concurrent operation jammer (block 1781). In one example, the flow diagram of FIG. 17 is applied by a multicom unit. One example of the multicom unit is the multicom radio mobile telephone illustrated in FIG. 13a.

One skilled in the art would understand that the jammer detector as disclosed in the present disclosure can be used with any type of receiver design, including a dual mode receiver, without affecting the spirit or scope of the present disclosure.

Those of skill would appreciate that the various illustrative components, logical blocks, modules, circuits, and/or algorithm steps described in connection with the examples disclosed herein may be implemented as electronic hardware, firmware, computer software, or combinations thereof. To clearly illustrate this interchangeability of hardware, firmware and software, various illustrative components, blocks, modules, circuits, and/or algorithm steps have been described above generally in terms of their functionality. Whether such functionality is implemented as hardware, firmware or software depends upon the particular application and design constraints imposed on the overall system. Skilled artisans may implement the described functionality in varying ways for each particular application, but such implementation decisions should not be interpreted as causing a departure from the scope or spirit of the present disclosure.

For example, for a hardware implementation, the processor(s) may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described therein, or a combination thereof. With software, the implementation may be through modules (e.g., procedures, functions, etc.) that perform the functions described therein. The software codes may be stored in memory units and executed by a processor. Additionally, the various illustrative flow diagrams, logical blocks, modules and/or algorithm steps described herein may also be coded as computer-readable instructions carried on any computer-readable medium known in the art.

In one or more examples, the steps or functions described herein may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Figure 18:
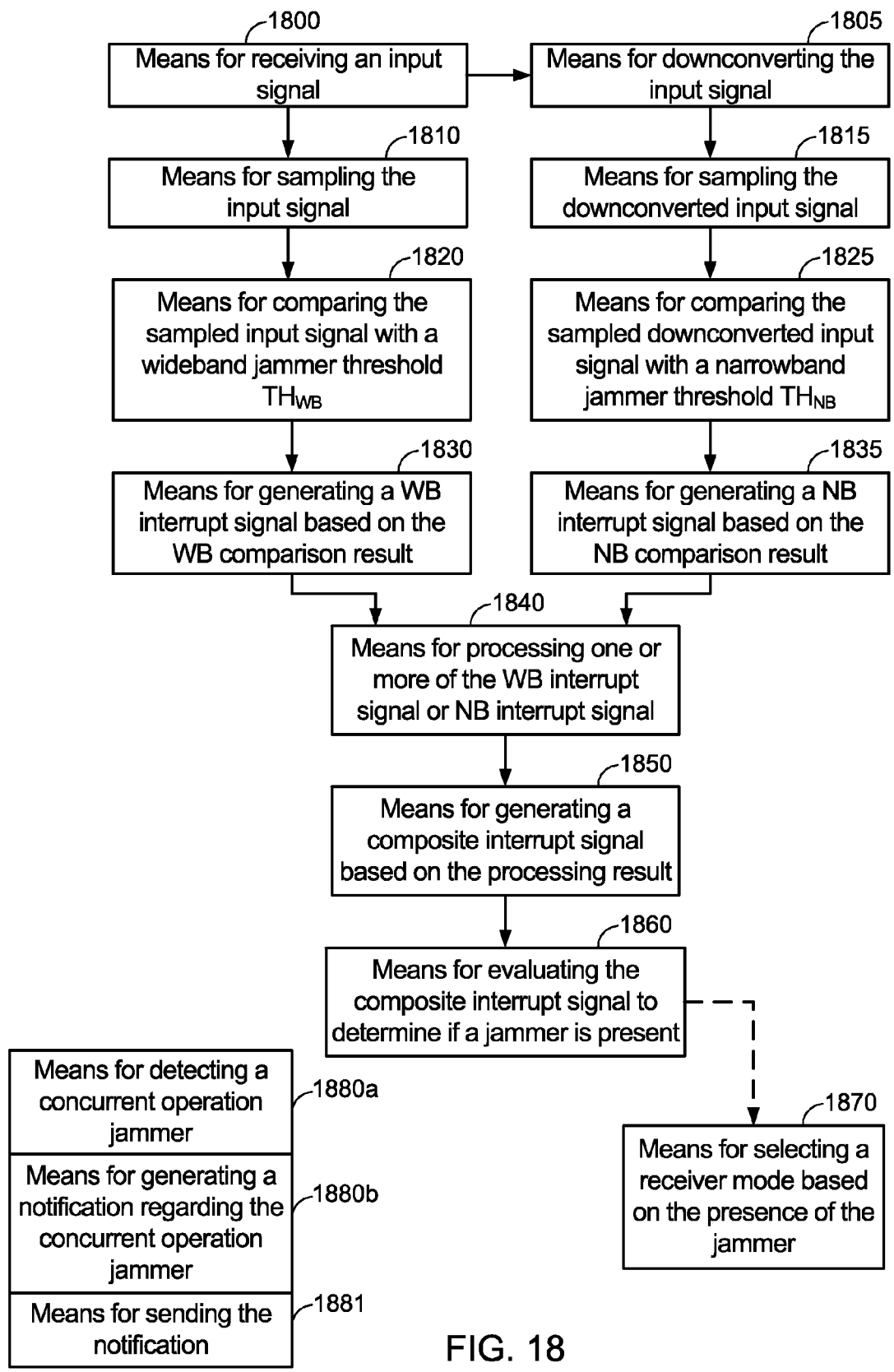
FIG. 18 illustrates an example of a device 1800 suitable for detecting a jammer.

In one example, the illustrative components, flow diagrams, logical blocks, modules and/or algorithm steps described herein are implemented or performed with one or more processors. In one aspect, a processor is coupled with a memory which stores data, metadata, program instructions, etc. to be executed by the processor for implementing or performing the various flow diagrams, logical blocks and/or modules described herein. FIG. 18 illustrates an example of a device 1800a suitable for detecting a jammer. In one aspect, the device 1800a is implemented by at least one processor comprising one or more modules configured to provide different aspects for toggling between dual modes (such as a high sensitivity mode and a high linearity mode) based on the input signal environment as described herein in blocks 1800, 1805, 1810, 1815, 1820, 1825, 1830, 1835, 1840, 1850, 1860, 1870, 1880a, 1880b, and 1881. In one example, the device 1800a is used to implement the algorithm illustrated in FIG. 17. For example, each module comprises hardware, firmware, software, or any combination thereof. In one aspect, the device 1800a is also implemented by at least one memory in communication with at least one processor. In one aspect, the at least one memory is located within the at least one processor. In another aspect, the at least one memory is external to the at least one processor. In one aspect, the at least one processor includes circuitry for implementing or performing the various flow diagrams, logical blocks and/or modules described herein.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the spirit or scope of the disclosure.

The invention claimed is:

1. A jammer detector comprising:
   a wideband jammer detector component configured to generate a wideband (WB) interrupt to indicate a presence of a far off in band jammer;
   a narrowband jammer detector component configured to generate a narrowband (NB) interrupt to indicate a presence of a close in jammer;
   an interrupt logic module configured to generate a composite interrupt signal based on at least one of the WB interrupt signal and the NB interrupt; and
   a software-based jammer detector configured to detect a concurrent operation jammer from a transmitter.

2. The jammer detector of claim 1 wherein the composite interrupt signal is used for power consumption.

3. The jammer detector of claim 2 wherein the power consumption is of an analog baseband low pass filter (ABB LPF).

4. The jammer detector of claim 1 wherein the wideband jammer detector covers a jammer spectrum of at least 4 octaves.

5. The jammer detector of claim 1 wherein the software-based jammer detector selects different mixer types.

6. The jammer detector of claim 5 wherein the different mixer types comprise a single-ended resistive mixer (SRM) and a harmonic reject mixer (HRM).

7. The jammer detector of claim 6, wherein the concurrent operation jammer is associated with a particular transmission, and wherein the software-based jammer detector is configured to detect the concurrent operation jammer prior to the particular transmission and to proactively switch a receiver mixer from the SRM to the HRM.

8. The jammer detector of claim 1 wherein the software-based jammer detector includes a coexistence management unit configured to monitor power consumption of a multicom unit.

9. The jammer detector of claim 8 wherein the coexistence management unit provides a power consumption current log.

10. The jammer detector of claim 8 wherein the coexistence management unit manages the operations of a receiver by notifying expected transmissions or by organizing a silence for the receiver.

11. The jammer detector of claim 8 wherein the coexistence management unit maps a spectrum, a radio frequency (RF) level, a transmit level or any combination thereof based on Global Positioning System (GPS) location.

12. The jammer detector of claim 1 wherein the narrowband jammer detector, the wideband jammer detector and the software-based jammer detector provide jammer detection against off-air jammers and concurrent jammers.

13. The jammer detector of claim 1 further comprising a software-based module configured to receive an a priori notification of a concurrent operation jammer activity.

14. The jammer detector of claim 13 wherein the software-based module relays a priori notification to at least one receiver.

15. The jammer detector of claim 1 further comprising a memory configured to store at least one wideband threshold ($TH_{WB}$) and at least one narrowband threshold ($TH_{NB}$).

16. The jammer detector of claim 15 wherein the at least one wideband threshold ($TH_{WB}$) is adaptive based on wanted power.

17. The jammer detector of claim 15 wherein the at least one narrowband threshold ($TH_{NB}$) is adaptive based on wanted power.

18. The jammer detector of claim 15 wherein the at least one wideband threshold ($TH_{WB}$) or the at least one narrowband threshold ($TH_{NB}$) is loaded by an automatic threshold setting logic.

19. The jammer detector of claim 18 wherein the automatic threshold setting logic is based on a gain state of a radio frequency integrated circuit (RFIC).

20. The jammer detector of claim 15 wherein a value of the at least one wideband threshold ($TH_{WB}$) is greater than a value of the at least one narrowband threshold ($TH_{NB}$).

21. The jammer detector of claim 15 wherein the at least one wideband threshold ($TH_{WB}$) or the at least one narrowband threshold ($TH_{NB}$) is selected based on a time of a receiver in a highest gain state G0.

22. The jammer detector of claim 15 wherein the wideband jammer detector component uses the wideband threshold ($TH_{WB}$) to determine the presence of the far off in band jammer and the narrowband jammer detector component uses the narrowband threshold ($TH_{NB}$) to determine the presence of the close in jammer.

23. The jammer detector of claim 1 wherein the wideband jammer detector component samples an input signal at an output of a low noise amplifier (LNA) of a receiver or at a LNA input of the receiver.

24. The jammer detector of claim 23 wherein the receiver is a dual mode receiver comprising a high linearity mode and a high sensitivity mode.

25. The jammer detector of claim 24 wherein selection of operating the receiver at the high linearity mode or at the high sensitivity mode is based on a value of the composite interrupt signal.

26. The jammer detector of claim 23 wherein the narrowband jammer detector component operates within a bandwidth of the receiver.

27. A device for detecting a jammer comprising:
a wideband jammer detector configured to generate a wideband (WB) interrupt signal to indicate a presence of a far off in band jammer;
a narrowband jammer detector configured to generate a narrowband (NB) interrupt signal to indicate a presence of a close in jammer;
an interrupt logic module configured to generate a composite interrupt signal based on at least one of the WB interrupt signal and the NB interrupt signal; and
means for detecting a concurrent operation jammer from a transmitter.

28. The device of claim 27 wherein the composite interrupt signal is used for power consumption.

29. The device of claim 28 wherein the power consumption is of an analog baseband low pass filter (ABB LPF).

30. The device of claim 27 wherein the wideband jammer detector covers a jammer spectrum of at least 4 octaves.

31. The device of claim 27 wherein the narrowband jammer detector, the wideband jammer detector and the means for detecting provide jammer detection against off-air jammers and concurrent jammers.

32. The device of claim 27 further comprising means for receiving an a priori notification of a concurrent operation jammer activity and for relaying a priori notification to a receiver.

33. A wireless communication unit for jammer detection comprising:
a plurality of receivers associated with at least one of a plurality of applications;
a plurality of transmitters associated with the at least one of the plurality of applications;
a wideband jammer detector configured to generate a wideband (WB) interrupt signal to indicate a presence of a wideband jammer;
a narrowband jammer detector configured to generate a narrowband (NB) interrupt signal to indicate a presence of a narrowband jammer;
an interrupt logic module configured to generate a composite interrupt signal based on at least one of the WB interrupt signal and the NB interrupt signal;
a software-based jammer detector configured to detect a concurrent operation jammer from one of the plurality of transmitters; and
a software-based module configured to send a notification of the concurrent operation jammer to at least one of the plurality of receivers.

34. The wireless communication unit of claim 33 wherein the composite interrupt signal is used for power consumption.

35. The wireless communication unit of claim 34 wherein the power consumption is of an analog baseband low pass filter (ABB LPF).

36. The wireless communication unit of claim 33 wherein the software-based jammer detector selects different mixer types.

37. The wireless communication unit of claim 36 wherein the different mixer types comprise a single-ended resistive mixer (SRM) and a harmonic reject mixer (HRM).

38. The wireless communication unit of claim 33 wherein the software-based jammer detector includes a coexistence management unit configured to monitor power consumption of a multicom unit.

39. The wireless communication unit of claim 38 wherein the coexistence management unit provides a power consumption current log.

40. The wireless communication unit of claim 38 wherein the coexistence management unit manages the operations of a particular receiver by notifying expected transmissions or by organizing a silence for the particular receiver.

41. The wireless communication unit of claim 38 wherein the coexistence management unit maps a spectrum, a RF level, a transmit level or any combination thereof based on Global Positioning System (GPS) location.

42. The wireless communication unit of claim 33 wherein the wideband jammer detector covers a jammer spectrum of at least 4 octaves.

43. The wireless communication unit of claim 33 wherein the narrowband jammer detector, the wideband jammer detector and the software-based jammer detector provide jammer detection against off-air jammers and concurrent jammers.

44. The wireless communication unit of claim 33 further comprising at least one notch filter configured to reject concurrent transmitter power leakage into one of the plurality of receivers.

45. The wireless communication unit of claim 44 wherein the at least one notch filter is activated when the software-based jammer detector detects a concurrent transmission.

46. The wireless communication unit of claim 44 wherein the at least one notch filter is activated when the software-based jammer detector receives an interference above a predetermined value.

47. The wireless communication unit of claim 44 wherein the at least one notch filter is activated when either the wideband jammer detector or the narrowband jammer detector detects a concurrent transmission.

48. The wireless communication unit of claim 44 wherein the at least one notch filter is activated permanently.

49. The wireless communication unit of claim 33 wherein the plurality of applications include Bluetooth, Global Positioning System (GPS), frequency modulation (FM) radio, (Wireless Fidelity (WiFi), Mobile TV, Digital Video Broadcasting (DVB), Wireless Universal Serial Bus(USB), Ultra Wideband (UWB), NFC (Near Field Communication), radio frequency identification (RFID) technology), or any combination thereof.

50. A non-transitory computer-readable medium storing instructions that, when executed by a computer, cause the computer to:
sample an input signal to generate a sampled input signal;
downconvert the input signal to generate a downconverted input signal;
sample the downconverted input signal to generate a sampled downconverted (SD) input signal;
compare the sampled input signal to a wideband threshold $TH_{WB}$, and comparing the SD input signal to a narrowband threshold $TH_{NB}$;
generate a wideband (WB) interrupt signal based on the comparison to the $TH_{WB}$, and generating a narrowband (NB) interrupt signal based on the comparison to the $TH_{NB}$;
generate a composite interrupt signal based on one or more of the WB interrupt signal or the NB interrupt signal; and
detect a concurrent jammer operation from a transmitter.

51. The non-transitory computer-readable medium of claim 50 wherein the composite interrupt signal is used for power consumption.

52. The non-transitory computer-readable medium of claim 51 wherein the power consumption is of an analog baseband low pass filter (ABB LPF).

53. The non-transitory computer-readable medium of claim 50 wherein the wideband threshold $TH_{WB}$ is adaptive based on wanted power.

54. The non-transitory computer-readable medium of claim 50 wherein the narrowband threshold $TH_{NB}$ is adaptive based on wanted power.

55. The non-transitory computer-readable medium of claim 50 wherein the wideband threshold ($TH_{WB}$) or the narrowband threshold ($TH_{NB}$) is loaded by an automatic threshold setting logic.

56. The non-transitory computer-readable medium of claim 55 wherein the automatic threshold setting logic is based on a gain state of a radio frequency integrated circuit (RFIC).

57. The non-transitory computer-readable medium of claim 50 wherein the WB interrupt signal covers a jammer spectrum of at least 4 octaves.

58. The non-transitory computer-readable medium of claim 50 wherein a value of the wideband threshold ($TH_{WB}$) is greater than a value of the narrowband threshold ($TH_{NB}$).

59. The non-transitory computer-readable medium of claim 50 wherein the wideband threshold ($TH_{WB}$) or the narrowband threshold ($TH_{NB}$) is selected based on a time of a receiver in a highest gain state G0.

60. The non-transitory computer-readable medium of claim 50 further comprising instructions that, when executed by the computer, cause the computer to evaluate the composite interrupt signal to determine a presence of a jammer.

61. A method for detecting a jammer comprising:
sampling an input signal to generate a sampled input signal;
downconverting the input signal to generate a downconverted input signal, and sampling the downconverted input signal to generate a sampled downconverted (SD) input signal;
comparing the sampled input signal to a wideband threshold $TH_{WB}$, and comparing the SD input signal to a narrowband threshold $TH_{NB}$;
generating a wideband (WB) interrupt signal based on the comparison to the $TH_{WB}$, and generating a narrowband (NB) interrupt signal based on the comparison to the $TH_{NB}$;
generating a composite interrupt signal based on one or more of the WB interrupt signal or the NB interrupt signal; and
detecting a concurrent operation jammer from a transmitter.

62. The method of claim 61 wherein the composite interrupt signal is used for power consumption.

63. The method of claim 62 wherein the power consumption is of an analog baseband low pass filter (ABB LPF).

64. The method of claim 61 wherein the wideband threshold $TH_{WB}$ is adaptive based on wanted power.

65. The method of claim 61 wherein the narrowband threshold $TH_{NB}$ is adaptive based on wanted power.

66. The method of claim 61 wherein the wideband threshold ($TH_{WB}$) or the narrowband threshold ($TH_{NB}$) is loaded by an automatic threshold setting logic.

67. The method of claim 66 wherein the automatic threshold setting logic is based on a gain state of a radio frequency integrated circuit (RFIC).

68. The method of claim 61 wherein the WB interrupt signal covers a jammer spectrum of at least 4 octaves.

69. The method of claim 61 wherein a value of the wideband threshold ($TH_{WB}$) is greater than a value of the narrowband threshold ($TH_{NB}$).

70. The method of claim 61 wherein the wideband threshold ($TH_{WB}$) or the narrowband threshold ($TH_{NB}$) is selected based on a time of a receiver in a highest gain state G0.

71. The method of claim 61 further comprising evaluating the composite interrupt signal to determine a presence of the jammer.

72. The method of claim 71 further comprising receiving the input signal.

73. The method of claim 72 wherein the input signal is sampled at an output of a low noise amplifier (LNA) of a particular receiver or a LNA input of the particular receiver.

74. The method of claim 73 wherein the receiver is a dual mode receiver comprising two receiver modes.

75. The method of claim 74 further comprising selecting one of the two receiver modes based on a presence of the jammer.

76. The method of claim 75 wherein the two receiver modes comprise a high linearity mode and a high sensitivity mode.

77. The method of claim 72 wherein narrowband is defined as within a bandwidth of a particular receiver receiving the input signal.

78. The method of claim 61 wherein the WB interrupt signal is a first bit and the NB interrupt signal is a second bit.

79. The method of claim 78 wherein generating the composite interrupt signal comprises processing the first bit and the second bit.

* * * * *